United States Patent
Joei

(10) Patent No.: US 9,318,534 B2
(45) Date of Patent: Apr. 19, 2016

(54) SOLID-STATE IMAGE PICKUP DEVICE AND MANUFACTURING METHOD THEREOF, AND ELECTRONIC APPARATUS

(71) Applicant: SONY CORPORATION, Tokyo (JP)

(72) Inventor: Masahiro Joei, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/410,649

(22) PCT Filed: Jun. 27, 2013

(86) PCT No.: PCT/JP2013/067633
§ 371 (c)(1),
(2) Date: Dec. 23, 2014

(87) PCT Pub. No.: WO2014/007132
PCT Pub. Date: Jan. 9, 2014

(65) Prior Publication Data
US 2015/0194469 A1 Jul. 9, 2015

(30) Foreign Application Priority Data

Jul. 5, 2012 (JP) ................................. 2012-151006

(51) Int. Cl.
| | | |
|---|---|---|
| *H01L 27/30* | (2006.01) | |
| *H01L 27/146* | (2006.01) | |
| *H01L 27/28* | (2006.01) | |
| *H01L 51/42* | (2006.01) | |

(52) U.S. Cl.
CPC .......... *H01L 27/307* (2013.01); *H01L 27/1461* (2013.01); *H01L 27/1464* (2013.01); *H01L 27/1469* (2013.01); *H01L 27/14605* (2013.01); *H01L 27/14623* (2013.01); *H01L 27/14634* (2013.01); *H01L 27/14638* (2013.01); *H01L 27/14645* (2013.01); *H01L 27/14665* (2013.01); *H01L 27/14683* (2013.01); *H01L 27/14685* (2013.01); *H01L 27/14687* (2013.01); *H01L 27/286* (2013.01); *H01L 51/42* (2013.01)

(58) Field of Classification Search
CPC ............ H01L 27/307; H01L 27/14605; H01L 27/14634; H01L 27/24623; H01L 27/286; H01L 27/1469; H01L 51/42
See application file for complete search history.

(56) References Cited

U.S. PATENT DOCUMENTS

2011/0019042 A1* 1/2011 Yamaguchi ................... 348/280

FOREIGN PATENT DOCUMENTS

| JP | H03-169078 | 7/1991 |
|---|---|---|
| JP | H07-74247 | 3/1995 |
| JP | H10-22236 | 1/1998 |
| JP | 2010-186818 | 8/2010 |
| JP | 2010-258438 | 11/2010 |
| JP | 2011-138927 | 7/2011 |
| JP | 2011-228648 | 11/2011 |
| JP | 2011-243945 | 12/2011 |

OTHER PUBLICATIONS

International Search Report for Internatioanl (PCT) Patent Application No. PCT/JP2013/067633, mailed Jul. 30, 2013, 2 pages.

* cited by examiner

*Primary Examiner* — William Coleman
(74) *Attorney, Agent, or Firm* — Hazuki International, LLC

(57) ABSTRACT

Provided is a solid-state image pickup device that makes it possible to enhance image quality, and a manufacturing method thereof, and an electronic apparatus. A solid-state image pickup device includes a pixel section that includes a plurality of pixels, the pixels each including one or more organic photoelectric conversion sections, wherein the pixel section includes an effective pixel region and an optical black region, and the organic photoelectric conversion sections of the optical black region include a light-shielding film and a buffer film on a light-incidence side.

18 Claims, 27 Drawing Sheets

EFFECTIVE PIXEL REGION

OPTICAL BLACK REGION

EFFECTIVE PIXEL REGION

OPTICAL BLACK REGION

EFFECTIVE PIXEL REGION

OPTICAL BLACK REGION

EFFECTIVE PIXEL REGION

OPTICAL BLACK REGION

EFFECTIVE PIXEL REGION

SOLID-STATE IMAGE PICKUP DEVICE AND MANUFACTURING METHOD THEREOF, AND ELECTRONIC APPARATUS

CROSS REFERENCE TO RELATED APPLICATIONS

This application is a national stage application under 35 U.S.C. 371 and claims the benefit of PCT Application No. PCT/JP2013/067633 having an international filing date of Jun. 27,2013, which designated the U.S., which PCT application claimed the benefit of Japanese Patent Application No. 2012-151006 filed Jul. 5, 2012, the disclosure of both the above-identified applications are incorporated herein by reference.

TECHNICAL FIELD

The present disclosure relates to a solid-state image pickup device including an organic photoelectric conversion section that uses an organic film as a photoelectric conversion film, and a manufacturing method thereof, and an electronic apparatus including the solid-state image pickup device.

BACKGROUND ART

A photoelectric conversion element using an organic film has a configuration in which, for example, an organic film having a photoelectric conversion function is interposed between an upper electrode and a lower electrode. The upper electrode is covered with a sealing film in order to prevent oxygen or water from intruding in the organic film. The sealing film has high film stress (internal stress), and there is a possibility that the organic film is damaged, causing degradation in image quality such as a so-called white scar or the like. Accordingly, for example, Patent Literature 1 describes that the sealing film is made up of a plurality of layers, allowing film stress of the whole sealing film to be adjusted within a specific range.

CITATION LIST

Patent Literature

Patent Literature 1: JP 2011-228648A2

SUMMARY OF INVENTION

However, in the photoelectric conversion element using the organic film, not only the sealing film but also other various films are stacked on the organic film. Consequently, in order to enhance image quality, there has been a desire for a configuration that considers not only film stress of the sealing film but also those of other films.

It is therefore desirable to provide a solid-state image pickup device that makes it possible to enhance image quality, and a manufacturing method thereof, and an electronic apparatus including the solid-state image pickup device.

A solid-state image pickup device according to an embodiment of the present disclosure includes a pixel section that includes a plurality of pixels, the pixels each including one or more organic photoelectric conversion sections, wherein the pixel section includes an effective pixel region and an optical black region, and the organic photoelectric conversion sections of the optical black region include a light-shielding film and a buffer film on a light-incidence side.

In the solid-state image pickup device according to the embodiment of the present disclosure, in the organic photoelectric conversion sections of the optical black region, the light-shielding film and the buffer film are provided on the light-incidence side. Thus, an increase in dark currents in the optical black region due to film stress of the light-shielding film is restrained, as compared to the effective pixel region.

A method of manufacturing a solid-state image pickup device according to an embodiment of the present disclosure is a method of manufacturing a solid-state image pickup device, the solid-state image pickup device including a pixel section that includes a plurality of pixels, the pixels each including one or more organic photoelectric conversion sections, the method including: providing, in the pixel region, an effective pixel region and an optical black region; forming, in the organic photoelectric conversion section of the effective pixel region, a first electrode, an organic semiconductor layer, and a second electrode in order, the organic semiconductor layer having a photoelectric conversion function; and forming, in the organic photoelectric conversion section of the optical black region, the first electrode, the organic semiconductor layer, the second electrode, and a light-shielding film in order, and forming a buffer layer on the second electrode side of the organic semiconductor layer.

An electronic apparatus according to an embodiment of the present disclosure is provided with a solid-state image pickup device, the solid-state image pickup device including a pixel section that includes a plurality of pixels, the pixels each including one or more organic photoelectric conversion sections, wherein the pixel section includes an effective pixel region and an optical black region, and the organic photoelectric conversion sections of the optical black region include a light-shielding film and a buffer film on a light-incidence side.

In the electronic apparatus according to the embodiment of the present disclosure, imaging is performed by the solid-state image pickup device according to the above-described embodiment of the present disclosure.

According to the solid-state image pickup device of the embodiment of the present disclosure, the method of manufacturing the solid-state image pickup device of the embodiment of the present disclosure, or the electronic apparatus of the embodiment of the present disclosure, in the organic photoelectric conversion sections of the optical black region, the light-shielding film and the buffer film are provided on the light-incidence side (on the second electrode side of the organic semiconductor layer). Hence, it is possible to relieve a difference in stress between the effective pixel region and the optical black region due to film stress of the light-shielding film, leading to enhanced image quality.

DESCRIPTION OF EMBODIMENTS

In the following, some embodiments of the present disclosure will be described in detail with reference to the drawings. It is to be noted that the order of description is as follows.

1. Embodiment (an example in which a buffer film is provided between an upper electrode and a protective film in an organic photoelectric conversion section in an optical black region)

2. Modification Example 1 (an example in which the buffer film is provided between the protective film and a light-shielding film)

3. Modification Example 2 (an example in which the buffer film is provided on the light-shielding film)

4. Modification Example 3 (an example in which the buffer film is provided between the organic photoelectric conversion layer and the upper electrode)

5. Modification Example 4 (an example of a case that holes are extracted as signal charges from a lower electrode side)

6. Modification Example 5 (an example of a case that electrons/holes are extracted as signal charges from an upper electrode side)

7. Application Example 1 (an example of an electronic apparatus (a camera))

Figure 1:
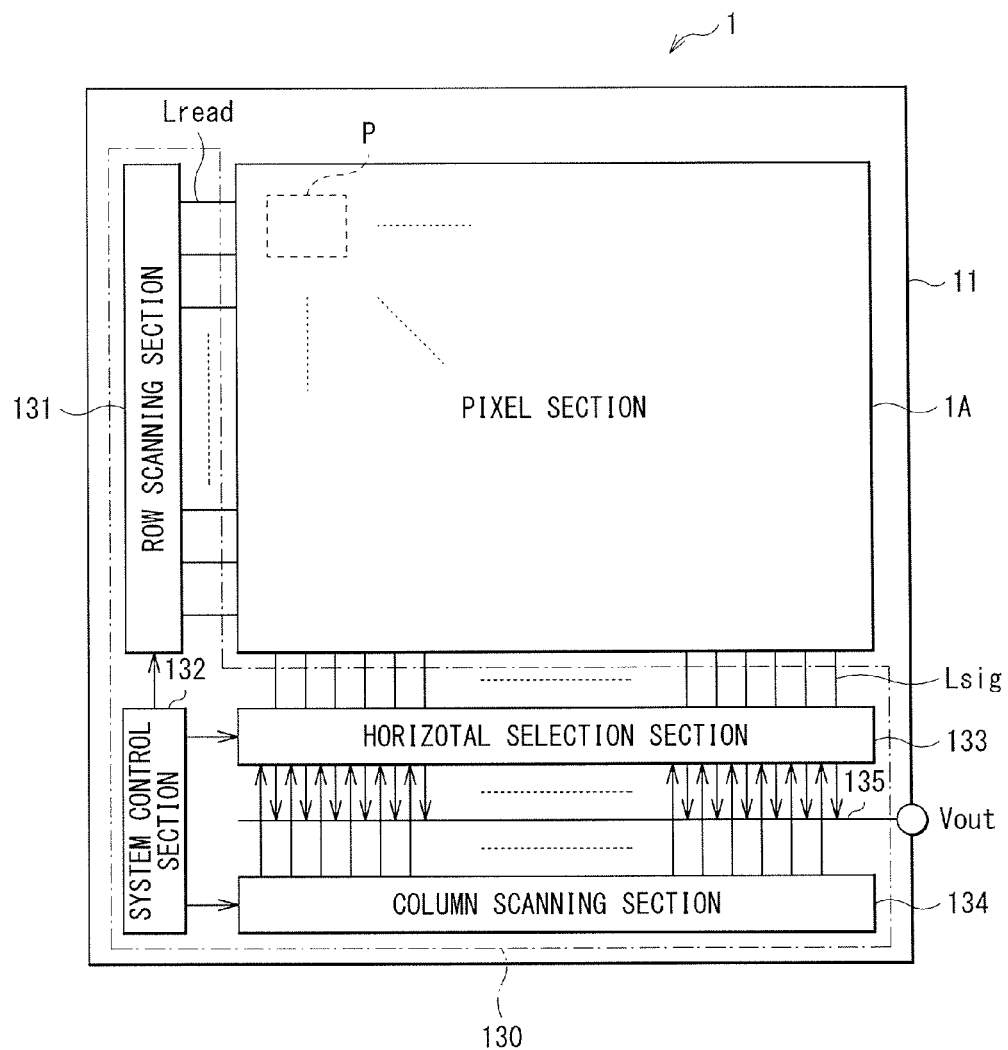
FIG. 1 is a functional block diagram of a solid-state image pickup device according to an embodiment of the present disclosure.

FIG. 1 illustrates an overall configuration of a solid-state image pickup device according to an embodiment of the present disclosure. The solid-state image pickup device 1 is, for example, a CMOS image sensor, includes a pixel section 1A as an imaging area on a semiconductor substrate 11, and may include a peripheral circuit section 130 in a peripheral region of the pixel section 1A. The peripheral circuit section 130 may include, for example, a row scanning section 131, a horizontal selection section 133, a horizontal selection section 134, and a system control section 132.

The pixel section 1A includes a plurality of pixels P (corresponding to photoelectric conversion elements 10B and 10C, which will be described later) that are two-dimensionally arranged in an array, for example. To the pixels P, for example, pixel drive lines Lread (such as row selection lines and reset control lines) may be wired for each pixel row, and vertical signal lines Lsig may be wired for each pixel column. The pixel drive lines Lread are adapted to transfer drive signals to read out signals from the pixels P. One ends of the pixel drive lines Lread may be connected to output terminals corresponding to the respective rows of the row scanning section 131.

The row scanning section 131 may be configured of shift registers and address decoders, and so forth, and may be a pixel drive section that is adapted to drive each of the pixels P in the pixel section 1A, for example, in units of rows. Signals that are outputted from the respective pixels P in a pixel row selected and scanned by the row scanning section 131 are adapted to be supplied to the horizontal selection section 133 through the respective vertical signal lines Lsig. The horizontal selection section 133 may be configured of amplifiers and horizontal selection switches, and so forth, which are provided for the respective vertical signal lines Lsig.

The horizontal selection section 134 may be configured of shift registers and address decoders, and so forth, and are adapted to scan and drive in order the respective horizontal selection switches of the horizontal selection section 133. By the selective scanning by the horizontal selection section 134, signals of the respective pixels P, which are transferred through the respective vertical signal lines Lsig, are adapted to be outputted to the horizontal signal lines 135 in order, and are adapted to be transferred to the outside of the semiconductor substrate 11 through the horizontal signal lines 135.

The circuit portion that is made up of the row scanning section 131, the horizontal selection section 133, the horizontal selection section 134, and the horizontal signal lines 135 may be directly formed on the semiconductor substrate 11, or alternatively, may be mounted on an external control IC. Moreover, the circuit portion may be formed on one or more other substrates that are connected through a cable or the like.

The system control section 132 is adapted to receive a clock that is given from the outside of the semiconductor substrate 11, or data that instructs operation modes, or the like, and, moreover, to output data such as internal information of the solid-state image pickup device 1. The system control section 132 may further include a timing generator that is adapted to generate various timing signals, and is adapted to drive and control, based on the various timing signals generated in the timing generator, the peripheral circuits such as the row scanning section 131, the horizontal selection section 133, and the horizontal selection section 134.

Figure 2:
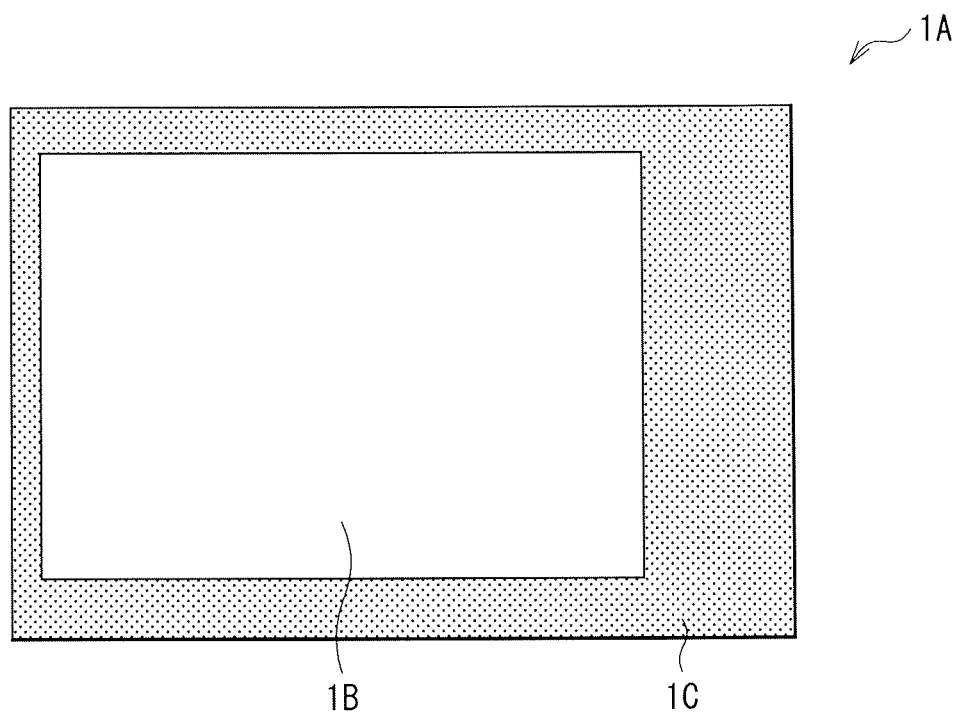
FIG. 2 is a plan view illustrating a configuration of a pixel section illustrated in FIG. 1.

FIG. 2 illustrates an example of a planar configuration of the pixel section 1A illustrated in FIG. 1. The pixel section 1A includes, for example, an effective pixel region 1B and an optical black region 1C (hereinbelow, "the OB region"). The effective pixel region 1B is a region of pixels that are capable of outputting (collecting light) as picture signals, among pixels provided in the pixel section 1A, and may occupy the center portion of the pixel region 1A. The OB region 1C is a region of pixels that are adapted to define reference of black in the picture signals, and may be provided in a peripheral region of the effective pixel region 1B in a form of a frame.

Figure 3:
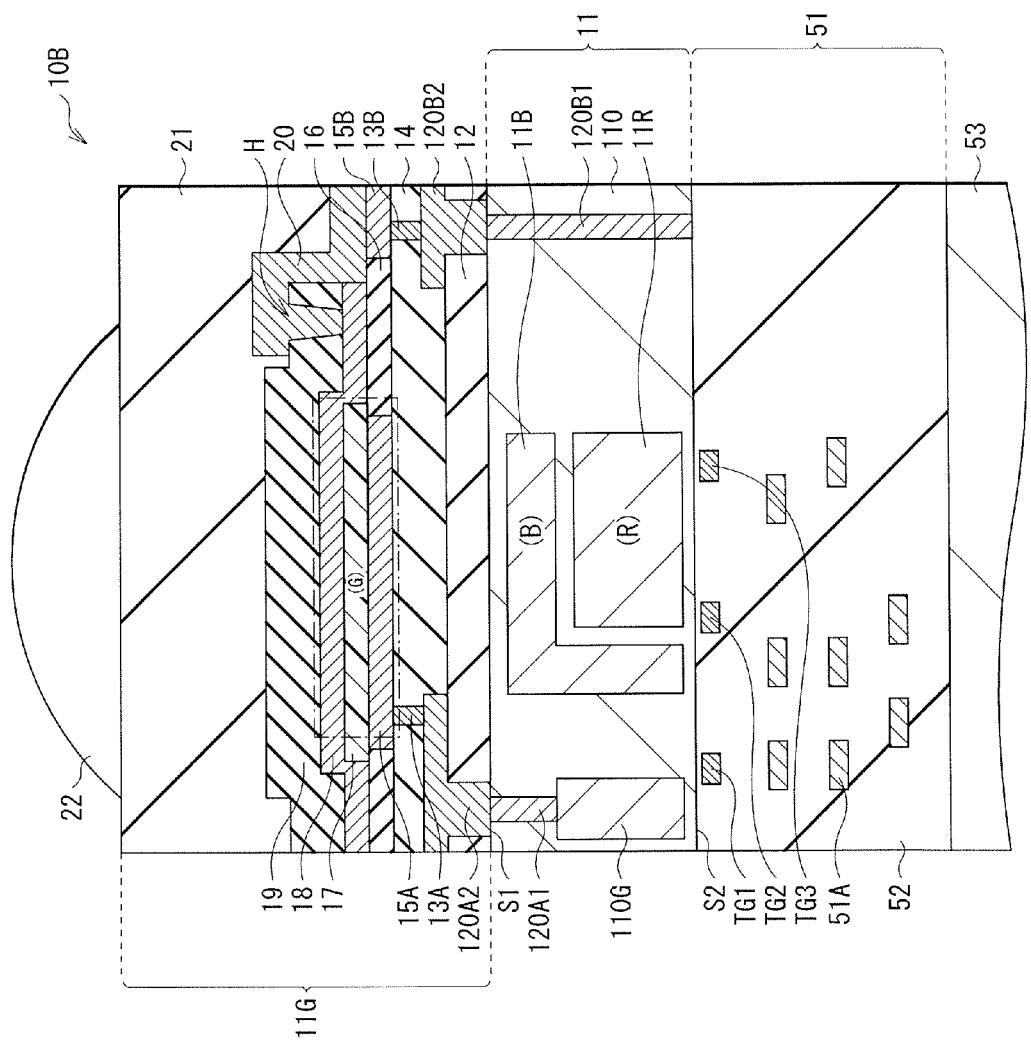
FIG. 3 is a cross-sectional view illustrating an overall configuration of a photoelectric conversion element in an effective pixel region illustrated in FIG. 2.

FIG. 3 illustrates a cross-sectional configuration of a photoelectric conversion element 10B in the effective pixel region 1B. The photoelectric conversion element 10B constitutes one pixel P in the effective pixel region 1B.

The photoelectric conversion element 10B may have a configuration in which, for example, one or more organic photoelectric conversion sections and one or more inorganic photoelectric conversion sections are vertically stacked and are adapted to selectively detect light of different wavelength ranges from one another to perform photoelectric conversion. Thus, in the solid-state image pickup device 1, it is possible to obtain a plurality of kinds of color signals in one pixel P without using color filters. Specifically, the photoelectric conversion element 10B may have a stacked structure of one organic photoelectric conversion section 11G and two inorganic photoelectric conversion sections 11B and 11R, making it possible to obtain color signals for each of red (R), green (G), and blue (B). The organic photoelectric conversion section 11G is provided on a rear surface (a surface S1) of the semiconductor substrate 11, and the rear surface (the surface S1) serves as a light-receiving surface. The inorganic photoelectric conversion sections 11B and 11R are embedded in the semiconductor substrate 11.

The photoelectric conversion element 10B may include pixel transistors (that may include transfer transistors Tr1 to Tr3, which will be described later) on a front surface (a surface S2 opposite to the light-receiving surface) side of the semiconductor substrate 11, and may include a multi-layered wiring layer (a multi-layered wiring layer 51) as well. In the following, description will be given on a configuration of each component.

(Semiconductor Substrate 11)

The semiconductor substrate 11 may have a configuration in which, for example, the inorganic photoelectric conversion sections 11B and 11R, and a storage layer for green 110G are embedded in predetermined regions of an n-type silicon (Si) layer 110. In the semiconductor substrate 11, there may be also embedded conductive plugs 120A1 and 120B1 that serve as transfer routes of charges (electrons or holes) from the organic photoelectric conversion section 11G On the front surface (the surface S2) side of the semiconductor substrate 11, there may be provided a plurality of pixel transistors (that may include the transfer transistors Tr1 to Tr3) corresponding to each of the organic photoelectric conversion section 11G and the inorganic photoelectric conversion sections 11B and 11R, as well as the peripheral circuit section 130 as described above.

Examples of the pixel transistors may include the transfer transistor, a reset transistor, an amplifier transistor, and a selector transistor. These pixel transistors may be configured of, for example, MOS transistors and may be formed in a p-type semiconductor well region on the surface S2 side. A circuit including such pixel transistors may be provided for each photoelectric conversion section for red, green, and blue. Each circuit may have a 3-transistor configuration including three transistors in total among these pixel transistors, for example, the transfer transistor, the reset transistor, and the amplifier transistor, or may have a 4-transistor configuration including the selector transistor in addition thereto. Here, among these pixel transistors, illustration and description will be given on only the transfer transistors Tr1 to Tr3. Moreover, the pixel transistors other than the transfer transistors may be shared by the photoelectric conversion sections or by the pixels. Moreover, a so-called pixel share structure in which a floating diffusion is shared may be also applied.

The transfer transistors Tr1 to Tr3 may be configured including gate electrodes (gate electrodes TG1 to TG3) and floating diffusions (FD113, 114, and 116). The transfer transistor Tr1 is adapted to transfer, to the vertical signal line Lsig, signal charges (electrons in the present embodiment) corresponding to green color, which are generated in the organic photoelectric conversion section 11G and accumulated in the storage layer for green 110G. The transfer transistor Tr2 is adapted to transfer, to the vertical signal line Lsig, signal charges (electrons in the present embodiment) corresponding to blue color, which are generated and accumulated in the inorganic photoelectric conversion section 11B. Similarly, the transfer transistor Tr3 is adapted to transfer, to the vertical signal line Lsig, signal charges (electrons in the present embodiment) corresponding to red color, which are generated and accumulated in the inorganic photoelectric conversion section 11R.

The inorganic photoelectric conversion sections 11B and 11R may be configured of photodiodes each including a p-n junction, and may be formed in the order named, from the surface S1 side, along an optical path in the semiconductor substrate 11. Among these, the inorganic photoelectric conversion section 11B is adapted to selectively detect blue color light to accumulate signal charges corresponding to blue color, and may extend, for example, from a selective region along the surface S1 of the semiconductor substrate 11 to a region in the vicinity of an interface with the multi-layered wiring layer 51. The inorganic photoelectric conversion section 11R is adapted to selectively detect red color light to accumulate signal charges corresponding to red color, and may be provided, for example, in a lower region than the inorganic photoelectric conversion section 11B (on the surface S2 side). It is to be noted that blue (B) and red (R) are colors corresponding to wavelength ranges of, for example, 450 nm to 495 nm both inclusive, and, for example, 620 nm to 750 nm both inclusive, respectively. The inorganic photoelectric conversion sections 11B and 11R may be capable of detecting light of part or all of the respective wavelength ranges.

Figure 4:
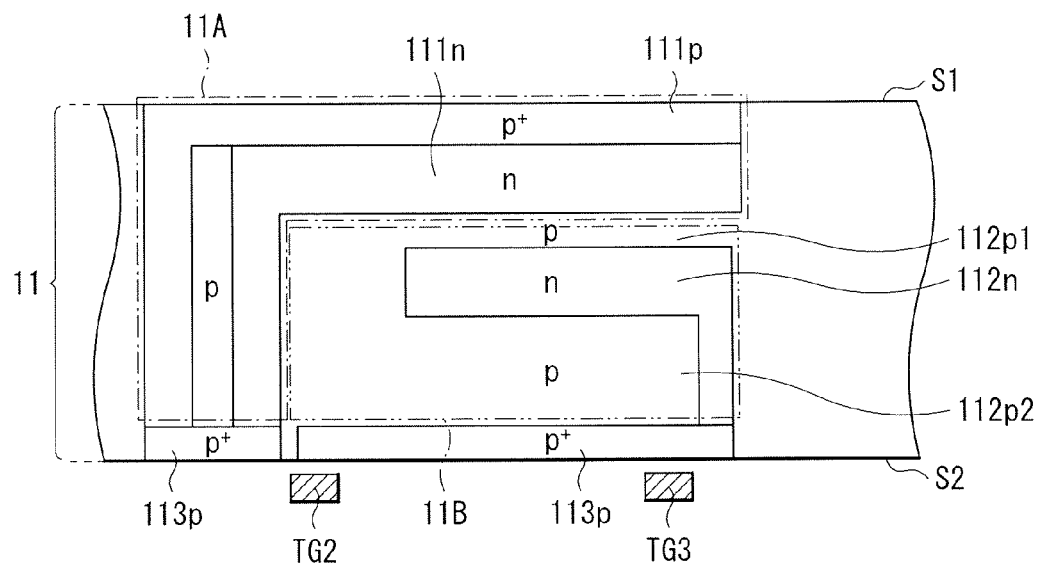
FIG. 4 is a cross-sectional view illustrating one configuration example of an inorganic photoelectric conversion element illustrated in FIG. 3.
Figure 5:
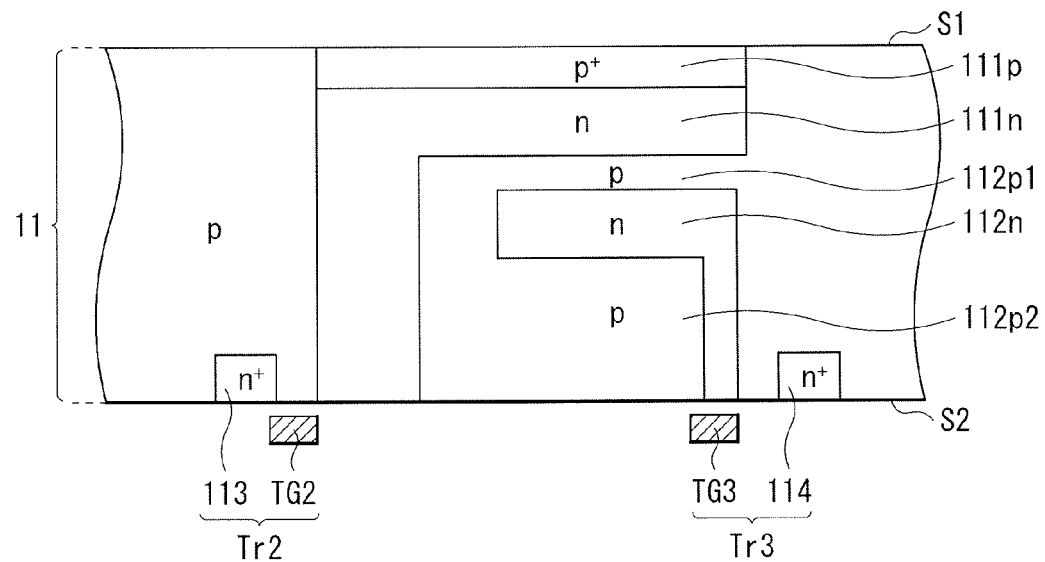
FIG. 5 is a cross-sectional view, in another cutting plane, illustrating one configuration example of the inorganic photoelectric conversion element illustrated in FIG. 4.

FIG. 4 illustrates a detailed configuration example of the inorganic photoelectric conversion sections 11B and 11R. FIG. 5 corresponds to a configuration in another cutting plane in FIG. 4. It is to be noted that, in the present embodiment, description will be given on a case that electrons are read out as signal charges from pairs of electrons and holes that are generated by photoelectric conversion (a case that an n-type semiconductor region serves as a photoelectric conversion layer). Moreover, in the figures, a superscript "+" to a "p" or an "n" denotes that a p-type or an n-type impurity concentration is high. Moreover, among the pixel transistors, the gate electrodes TG2 and TG3 of the transfer transistors Tr2 and Tr3 are also illustrated.

The inorganic photoelectric conversion section 11B may be configured including, for example, a p-type semiconductor region 111p (in the following, simply referred to as a p-type region, which applies to a case of n-type) that serves as a hole-accumulation layer, and an n-type photoelectric conversion layer (an n-type region) 111n that serves as an electron-accumulation layer. The p-type region 111p and the n-type photoelectric conversion layer 111n each may be provided in a selective region in the vicinity of the surface S1, and each may include a portion that is bent and extended to reach an interface with the surface S2. The p-type region 111p may be connected to an undepicted p-type semiconductor well region on the surface S1 side. The n-type photoelectric conversion layer 111n may be connected to the FD 113 (an n-type region) of the transfer transistor Tr2 for blue color. It is to be noted that, in the vicinity of an interface between the surface S2 and the respective ends, on the surface S2 side, of the p-type region 111p and the n-type photoelectric conversion layer 111n, a p-type region 113p (a hole-accumulation layer) may be provided.

The inorganic photoelectric conversion section 11R may have a configuration in which, for example, an n-type photoelectric conversion layer 112n (an electron-accumulation layer) is interposed between p-type regions 112p1 and 112p2 (hole-accumulation layers) (may have a p-n-p stacked structure). The n-type photoelectric conversion layer 112n may include a portion that is bent and extended to reach an interface with the surface S2. The n-type photoelectric conversion layer 112n may be connected to the FD 114 (an n-type region) of the transfer transistor Tr3 for red color. It is to be noted that, in the vicinity of an interface between an end, on the surface S2 side, of at least the n-type photoelectric conversion layer 111n, and the surface S2, a p-type region 113p (a hole-accumulation layer) may be provided.

Figure 6:
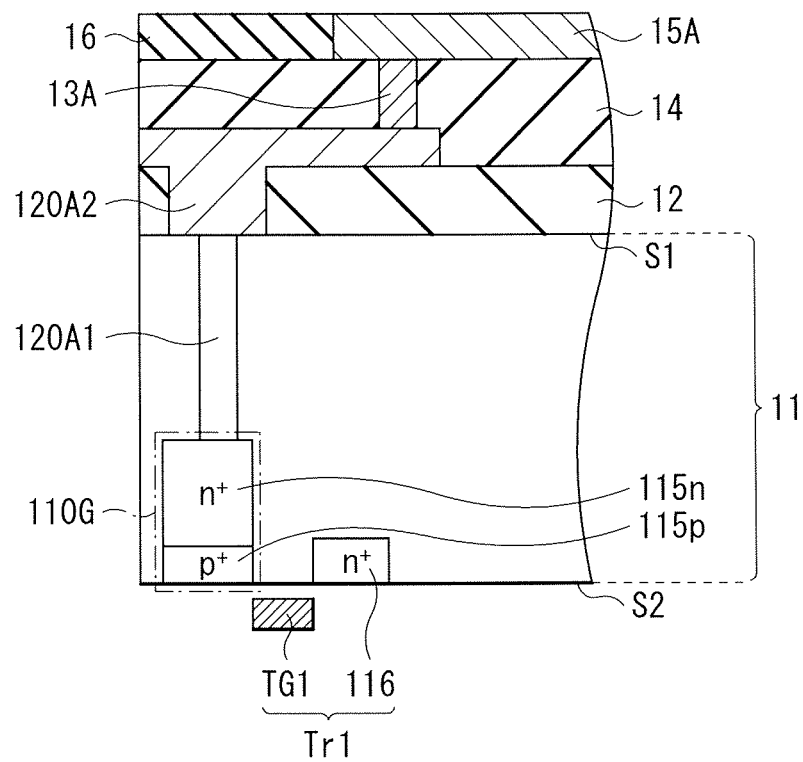
FIG. 6 is a cross-sectional view illustrating a configuration (extraction of electrons from a lower side) of a charge (electron) accumulation layer in an organic photoelectric conversion section illustrated in FIG. 3.

FIG. 6 illustrates a detailed configuration example of the storage layer for green 110E It is to be noted that, here, description will be given on a case that electrons are read out, from a lower electrode 15A side, as signal charges from pairs of electrons and holes that are generated by the organic photoelectric conversion section 11G Moreover, in FIG. 6, among the pixel transistors, the gate electrode TG1 of the transfer transistor Tr1 is also illustrated.

The storage layer for green 110G may include an n-type region 115n that serves as an electron-accumulation layer. A part of the n-type region 115n may be connected to the conductive plug 120A1 and is adapted to accumulate electrons that are transferred from the lower electrode 15A side through the conductive plug 120A1. The n-type region 115n may be also connected to the FD 116 (an n-type region) of the transfer transistor Tr1 for green color. It is to be noted that, in the vicinity of an interface between the n-type region 115n and the surface S2, a p-type region 115p (a hole-accumulation layer) may be formed.

The conductive plugs 120A1 and 120B1 as illustrated in FIG. 3 function as connectors between the organic photoelectric conversion section 11G and the semiconductor substrate 11 together with conductive plugs 120A2 and 120B2, which will be described later, and serve as transfer routes of electrons or holes that are generated in the organic photoelectric conversion section 11G. The conductive plug 120A1 may be conducted to, for example, the lower electrode 15A of the organic photoelectric conversion section 11G, and may be connected to the storage layer for green 110G. The conductive plug 120B1 may be conducted to an upper electrode 18 of the organic photoelectric conversion section 11G, and serves as a wiring to discharge holes.

The conductive plugs 120A1 and 120B1 each may be configured of, for example, a conductive semiconductor layer, and each may be formed and embedded in the semiconductor substrate 11. In this case, preferably, the conductive plug 120A1 may be n-type (to serve as a transfer route of electrons), while the conductive plug 120B1 may be p-type (to serve as a transfer route of holes). Alternatively, the conductive plugs 120A1 and 120B1 each may be configured of, for example, a conductive film material such as tungsten or the like filled in a through-via. In this case, in order to prevent, for example, short-circuits with silicon, it is desirable that side surfaces of the via be covered with an insulating film such as silicon oxide ($SiO_2$) or silicon nitride (SiN).

(Multi-layered Wiring Layer 51)

The multi-layered wiring layer 51 as illustrated in FIG. 3 may be provided on the surface S2 of the semiconductor substrate 11, and may have a configuration in which a plurality of wires 51A are disposed with an interlayer insulating layer 52 in between. Thus, in the photoelectric conversion element 10B, the multi-layered wiring layer 51 is provided on an opposite side to the light-receiving surface (the surface S1) of the semiconductor substrate 11, making it possible to attain the solid-state image pickup device 1 of a so-called backside illumination type. To the multi-layered wiring layer 51, a support substrate 53 made of, for example, silicon may be bonded.

(Organic Photoelectric Conversion Section 11G)

The organic photoelectric conversion section 11G as illustrated in FIG. 3 is an organic photoelectric conversion element that is adapted to absorb light of a selective wavelength range (here, green color light) using organic semiconductor, and to generate pairs of electrons and holes. The organic photoelectric conversion section 11G may have a configuration in which an organic photoelectric conversion layer 17 is interposed between a pair of electrodes to extract signal charges (the lower electrode 15A and the upper electrode 18). The lower electrode 15A and the upper electrode 18 may be electrically connected to the conductive plug 120A1 and 120B1 that are embedded in the semiconductor substrate 11, through a wiring layer or a contact metal layer, as will be described later.

Here, the lower electrode 15A corresponds to one specific example of "a first electrode" in the present disclosure. The organic photoelectric conversion layer 17 corresponds to one specific example of "an organic semiconductor layer" in the present disclosure. The upper electrode 18 corresponds to one specific example of "a second electrode" in the present disclosure.

More specifically, in the organic photoelectric conversion section 11G, on the surface S1 of the semiconductor substrate 11, there may be provided an interlayer insulating film 12, conductive plugs 120A2 and 120B2, an interlayer insulating film 14, wiring layers 13A and 13B, the lower electrode 15A and a wiring layer 15B, an insulating film 16, the organic photoelectric conversion layer 17, the upper electrode 18, a protective layer 19, and a contact metal layer 20, in this order.

The interlayer insulating film 12 may be desirably configured of an insulating film having a small interface level, in order to reduce an interface level with the semiconductor substrate 11 (the silicon layer 110) as well as to restrain occurrence of a dark current from an interface with the silicon layer 110. As such an insulating film, for example, a stacked film of a hafnium oxide ($HfO_2$) film and a silicon oxide ($SiO_2$) film may be used. However, a constituent material of the interlayer insulating film 12 is not particularly limited.

The conductive plugs 120A2 and 120B2 may be provided in regions that face the conductive plugs 120A1 and 120B1, respectively, and may be embedded in through holes in the interlayer insulating film 12. The conductive plug 120A2 functions as a connector together with the conductive plug 120A1 as described above, and forms a transfer route of charges (electrons) from the lower electrode 15A to the storage layer for green 110G, together with the conductive plug 120A1 and the wiring layer 13A. The conductive plug 120B2 functions as a connector together with the conductive plug 120B1 as described above, and forms a discharge route of charges (holes) from the upper electrode 18, together with the conductive plug 120B1, the wiring layer 13B, the wiring layer 15B, and the contact metal layer 20. The conductive plugs 120A2 and 120B2 may desirably have a stacked structure of a stacked film of titanium (Ti) and titanium nitride (TiN) as barrier metals and a metal film such as tungsten (W), in order to function as a light-shielding film as well. Moreover, the use of such a stacked structure may be desirable because it is possible for the conductive plugs 120A2 and 120B2 to securely make contact with silicon, even in a case that the conductive plugs 120A1 and 120B1 are formed as an n-type or p-type semiconductor layer.

The interlayer insulating film 14 may be configured of, for example, a single layer film made of one of silicon oxide, silicon nitride, and silicon oxinitride (SiON) and so on, or a stacked film made of two or more thereof.

The wiring layers 13A and 13B may be provided in regions that face the conductive plugs 120A2 and 120B2, respectively, and may be embedded in through holes in the interlayer insulating film 14. The wiring layers 13A and 13B may have a stacked structure of, for example, a TiN film and a W film.

The insulating film 16 is adapted to electrically separate the lower electrode 15A and the wiring layer 15B. Moreover, the insulating film 16 also has a function of electrically separating the lower electrodes 15A of the respective pixels P from one another in a case that the photoelectric conversion element 10B is used as the pixel P of the solid-state image pickup device 1. The insulating film 16 may be configured of, for example, a single layer film made of one of silicon oxide, silicon nitride, and silicon oxinitride (SiON) and so forth, or a stacked film made of two or more thereof. The insulating film 16, for example, may have its surface planarized, and may have a shape and a pattern that hardly have a difference in level with the lower electrode 15A and the wiring layer 15B.

The lower electrode 15A may directly face light-receiving surfaces of the inorganic photoelectric conversion sections 11B and 11R that are formed in the semiconductor substrate 11, and may be provided in a region that covers the light receiving surfaces thereof. The lower electrode 15A may be configured of a conductive film having light transmittance, for example, ITO (indium tin oxide). As a constituent material of the lower electrode 15A, in addition to ITO, a tin oxide ($SnO_2$)-based material doped with a dopant, or a zinc oxide (ZnO)-based material doped with a dopant may be also used. Examples of zinc oxide-based materials may include aluminum zinc oxide (ZnO doped with aluminum (Al) as a dopant, for example, AZO), gallium zinc oxide (ZnO doped with gallium (Ga) as a dopant, for example, GZO), indium zinc oxide (ZnO doped with indium (In) as a dopant, for example, IZO). Moreover, in addition to these, CuI, $InSbO_4$, ZnMgO, $CuInO_2$, $MgIN_2O_4$, CdO, $ZnSnO_3$, and so on, may be also used. It is to be noted that, in the present embodiment, signal charges (electrons) are extracted from the lower electrode 15A as described above. Therefore, in the solid-state image pickup device 1 using the photoelectric conversion element 10B as the pixel P, the lower electrodes 15A may be formed and separated from one another for each pixel P.

The wiring layer 15B may be provided in a region that faces the wiring layer 13B, and may be electrically separated from the lower electrode 15A by the insulating film 16.

The organic photoelectric conversion layer 17 may be provided on the lower electrode 15A, and may be configured of an organic semiconductor that is adapted to perform photoelectric conversion of light of a selective wavelength range while allowing light of other wavelength regions to pass through. The organic semiconductor may be desirably configured to include one or both of an organic p-type semiconductor or an organic n-type semiconductor. As such an organic semiconductor, any one of a quinacridone derivative, a naphthalene derivative, an anthracene derivative, a phenanthrene derivative, a tetracene derivative, a pyrene derivative, a perylene derivative, and a fluoranthene derivative may be preferably used. Alternatively, polymers of phenylenevinylene, fluorene, carbazole, indole, pyrene, pyrrole, picoline, thiophene, acetylene, diacetylene, or the like, or derivatives thereof may be also used. In addition, the following may be preferably used: a chain compound in which condensed polycyclic aromatic and aromatic or heterocyclic compounds such as a metal complex pigment, a cyanine based pigment, a merocyanine based pigment, a phenylxanthene based pigment, a triphenylmethane based pigment, a rhodacyanine based pigment, a xanthene based pigment, a macrocyclic azaannulene based pigment, an azulene based pigment, naphthoquinone, an anthraquinone based pigment, anthracene and pyrene and so forth are condensed; or two nitrogen-containing heterocycles such as quinoline, benzothiazole, benzoxazole or the like having a squalirium group and a croconic methine group as binding chains; or a cyanine-based similar pigment bound by a squalirium group and a croconic methine group; or the like. It is to be noted that, as the above-mentioned metal complex pigment, a dithiol metal complex based pigment, a metal phthalocyanine pigment, a metal porphyrin pigment, or a ruthenium complex pigment may be preferable, but these are not limitative. In the present embodiment, the organic photoelectric conversion layer 17 may be capable of photoelectric conversion of green color light corresponding to part or all of a wavelength range of, for example, 495 nm to 570 nm both inclusive. A thickness of the organic photoelectric conversion layer 17 may be, for example, 50 nm to 500 nm both inclusive.

Between the organic photoelectric conversion layer 17 and the lower electrode 15A, or between the organic photoelectric conversion layer 17 and the upper electrode 18, there may be provided undepicted one or more other layers. For example, in the order from the lower electrode 15A side, the following may be stacked: an undercoat film, an electron blocking film, the organic photoelectric conversion layer 17, a hole blocking film, a buffer film and a work function adjustment film.

The upper electrode 18 may be provided on an upper surface and a side surface of the organic photoelectric conversion layer 17, and may be configured of a conductive film having light transmittance similarly to the lower electrode 15A. In the present embodiment, as described above, holes extracted from the upper electrode 18 are discharged. Therefore, in the solid-state image pickup device 1 using the photoelectric conversion element 10 as the pixel P, the upper electrodes 18 may be separated from one another for each pixel P, or alternatively, may be formed as a common electrode to all the pixels P. A thickness of the upper electrode 18 may be, for example, 10 nm to 200 nm both inclusive.

The protective film 19 may be provided on the upper electrode 18. The protective film 19 may be configured of a material having light transmittance, for example, a single layer film made of any one of silicon oxide ($SiO_2$), silicon nitride (SiN), and silicon oxinitride and so on, or a stacked film made of two or more thereof. A thickness of the protective film 19 may be, for example, 100 nm to 30000 nm both inclusive.

The contact metal layer 20 may be filled in a contact hole H that is provided in the protective film 19, and may extend to an upper surface of the wiring layer 15B. The contact metal layer 20 may be configured of, for example, any one of titanium, tungsten, titanium nitride, and aluminum, and so on, or a stacked film made of two or more thereof.

On the protective film 19 and the contact metal layer 20, a planarization film 21 may be provided over the entire surfaces. On the planarization film 21, an on-chip lens 22 (a micro lens) may be provided. The on-chip lens 22 is adapted to allow light incident from above to condense toward the respective light-receiving surfaces of the organic photoelectric conversion section 11G, and the inorganic photoelectric conversion sections 11B and 11R. In the present embodiment, the multi-layered wiring layer 51 is formed on the surface S2 side of the semiconductor substrate 11. Therefore, it is possible to dispose the respective light-receiving surfaces of the organic photoelectric conversion section 11G, and the inorganic photoelectric conversion sections 11B and 11R close to one another, and to reduce dispersion in sensitivity among the respective colors, which is caused depending on an F value of the on-chip lens 22.

It is to be noted that, in the photoelectric conversion element 10B, signal charges (electrons) are extracted from the lower electrode 15A. Therefore, in the solid-state image pickup device 1 using this as the pixel, the upper electrode 18 may be a common electrode, as mentioned above. In this case, the transfer route that is formed by the contact hole H, the contact metal layer 20, the wiring layers 15B and 13B, and the conductive plugs 120B1 and 120B2 may be provided at least one place for all the pixels P.

Figure 7:
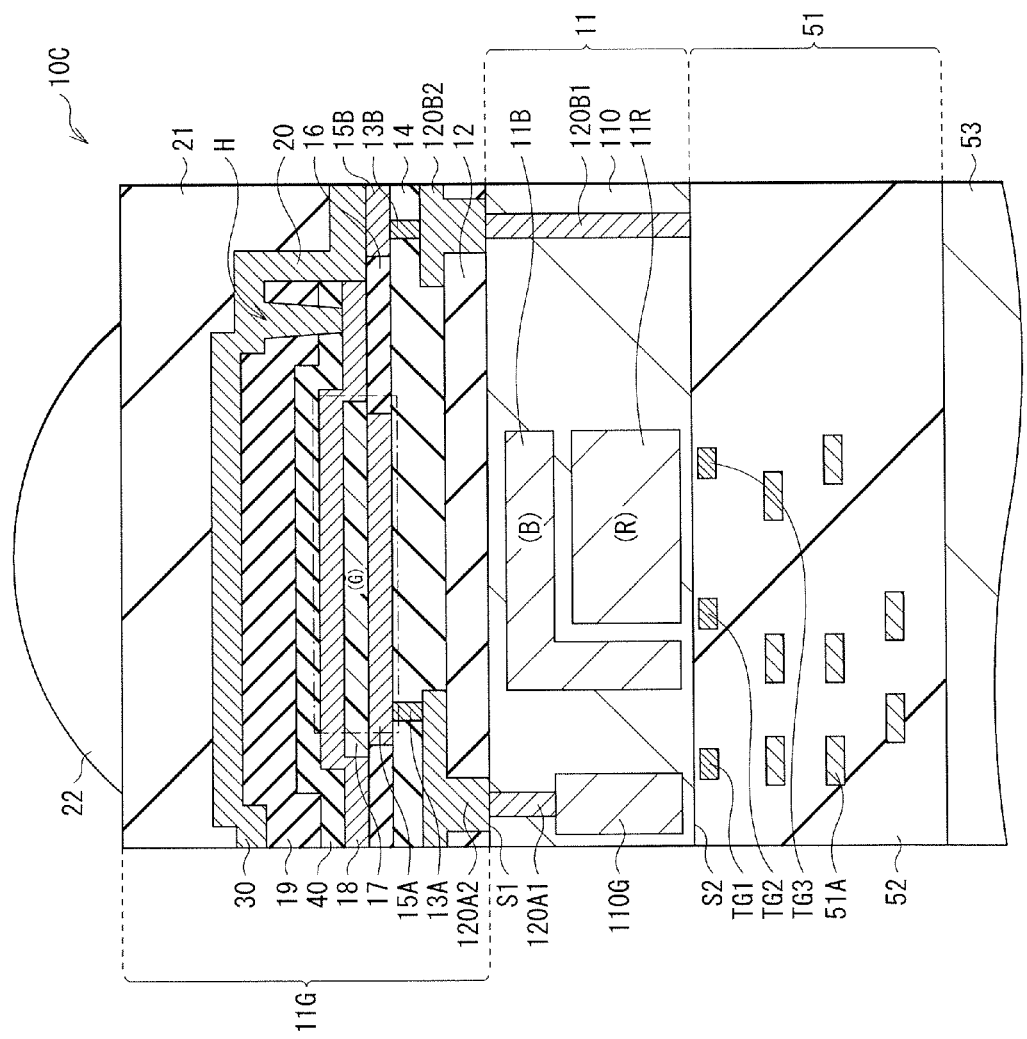
FIG. 7 is a cross-sectional view illustrating an overall configuration of a photoelectric conversion element in an optical black region illustrated in FIG. 2.

FIG. 7 illustrates a cross-sectional configuration of the photoelectric conversion element 10C in the OB region 1C. The photoelectric conversion element 10C constitutes one pixel P in the OB region 1C.

The photoelectric conversion element 10C may have a stacked structure of one organic photoelectric conversion section 11G and two inorganic photoelectric conversion sections 11B and 11R, similarly to the photoelectric conversion element 10B. The organic photoelectric conversion section 11G is provided on the rear surface (the surface S1) of the semiconductor substrate 11, and the rear surface (the surface S1) serves as the light-receiving surface. The inorganic photoelectric conversion sections 11B and 11R are embedded in the semiconductor substrate 11. Moreover, the photoelectric conversion element 10C may include the pixel transistors (that may include the transfer transistors Tr1 to Tr3) on the front surface (the surface S2 opposite to the light-receiving surface) side of the semiconductor substrate 11, and may include the multi-layered wiring layer (the multi-layered wiring layer 51) and the support substrate 53 as well.

In the photoelectric conversion element 10C, the inorganic photoelectric conversion sections 11B and 11R, the semiconductor substrate 11, the multi-layered wiring layer 51, and the support substrate 53 may be configured similarly to those of the photoelectric conversion element 10B.

The organic photoelectric conversion section 11G of the photoelectric conversion element 10C includes a light-shielding film 30 and a buffer film 40 on a light-incidence side. Thus, in the solid-state image pickup device 1, it is possible to enhance image quality.

The light-shielding film 30 is adapted to define reference of black (incident light is zero) in the picture signals, by preventing light from entering the organic photoelectric conversion section 11G, and the inorganic photoelectric conversion sections 11B and 11R. The light-shielding film 30 may be provided on the light-incidence side (on the upper electrode 18 side) of the organic photoelectric conversion layer 17, specifically on the protective film 19, may have a thickness of, for example, 200 nm, and may be configured of tungsten (W) or aluminum (Al). The thickness of the light-shielding film 30 may be desirably about 50 nm or more for shielding light, and about 500 nm may be sufficient for an upper limit. It is to be noted that the light-shielding film 30 may be combined with the contact metal layer 20, and may be provided as one film that is continuous with the contact metal layer 20.

The buffer film 40 has a function as a stress inversion film to relieve a difference in stress between the effective pixel region 1B and the OB region 1C, which is caused by film stress of the light-shielding film 30. The buffer film 40 may be provided on the light-incidence side of the organic photoelectric conversion layer 17, specifically between the upper electrode 18 and the protective film 19.

Figure 8:
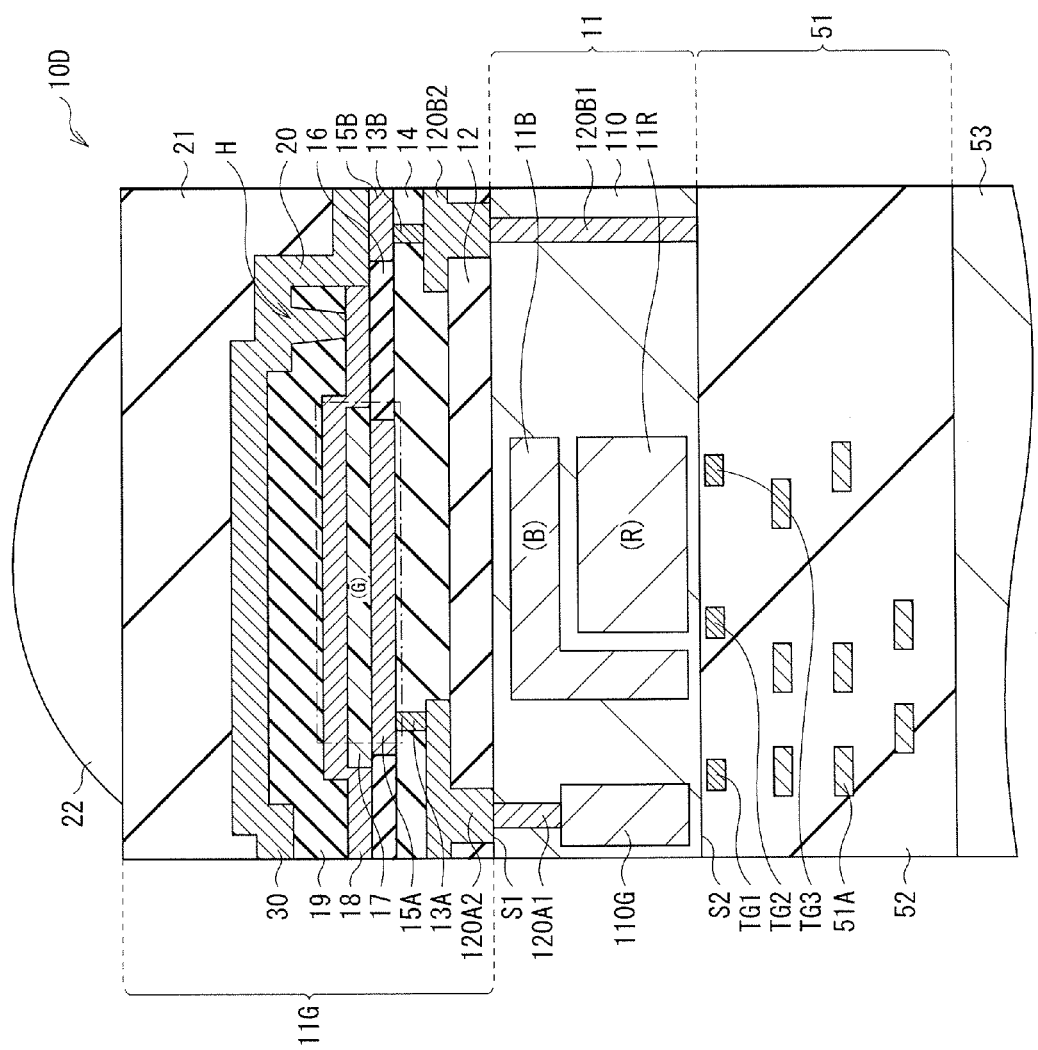
FIG. 8 is a cross-sectional view illustrating an overall configuration of a photoelectric conversion element including no buffer film.
Figure 9:
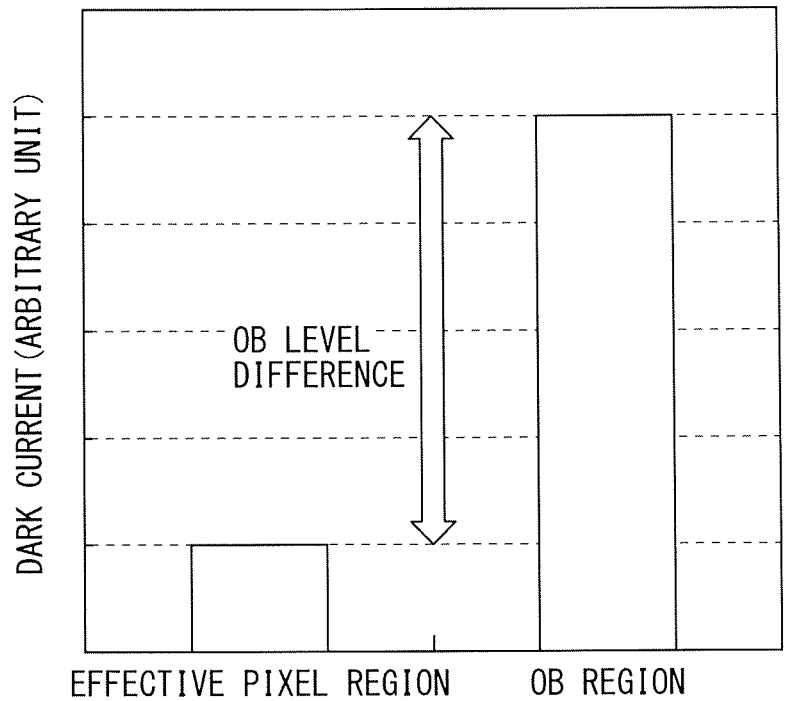
FIG. 9 is a diagram for explaining a difference in electrical level (an optical black level difference) between the effective pixel region and the optical black region.

To be more specific, a tungsten film that constitutes the light-shielding film 30 generally has a high film stress (for example, about +500 MPa, here "+" indicates tensile stress). Assume that the OB region 1C is provided with the photoelectric conversion element 10D that includes no buffer film 40 as illustrated in FIG. 8 while the effective pixel region 1B is provided with the photoelectric conversion element 10B as illustrated in FIG. 3. In this case, in the effective pixel region 1B, a sum of film stress of the upper electrode 18 and the protective film 19 is applied to the organic photoelectric conversion layer 17. On the other hand, in the OB region 1C, in addition thereto, the film stress of the light-shielding film 30 is applied. Accordingly, as illustrated in FIG. 9, in the OB region 1C, there occurs an increase in dark currents as compared to the effective pixel region 1B. A ratio of dark currents between the OB region 1C and the effective pixel region 1B is referred to as an optical black level difference (hereinbelow, "the OB level difference"). The buffer film 40 is adapted to lower a difference in stress between the OB region 1C and the effective pixel region 1B, leading to reduction in the OB level difference and enhancement in image quality.

Figure 10:
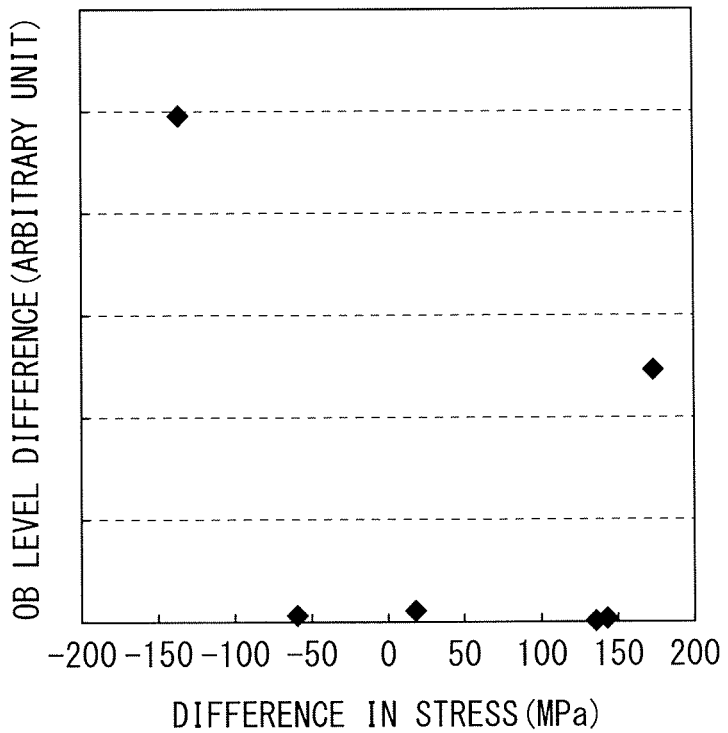
FIG. 10 is a diagram for explaining a relation of a difference in stress between the optical black region and the effective pixel region, and the optical black level difference.

FIG. 10 illustrates a relation of the difference in stress between the OB region 1C and the effective pixel region 1B, and the OB level difference. The difference in stress between the OB region 1C and the effective pixel region 1B refers to a difference between a sum of film stress on the light-incidence side (on the upper electrode 18 side) of the organic photoelectric conversion layer 17 in the OB region 1C and a sum of film stress on the light-incidence side (on the upper electrode 18 side) of the organic photoelectric conversion layer 17 in the effective pixel region 1B. As seen from FIG. 10, when the difference in stress between the OB region 1C and the effective pixel region 1B is smaller than −150 MPa ("−" indicates compressive stress), or is larger than +200 MPa, the OB level difference increases. This is because an increase in stress causes the organic photoelectric conversion layer 17 to be subjected to strain, contributing to an increase in dark currents. Consequently, the difference in stress between the OB region 1C and the effective pixel region 1B may be preferably −150 MPa to 200 MPa both inclusive.

Here, the film stress desirable for the buffer film 40 may be calculated using the following example. For example, suppose that film stress of the upper electrode 18 is +100 MPa, film stress of the protective film 19 is −500 MPa, and film stress of the light-shielding film 30 is +500 MPa. The sum of film stress on the light-incidence side of the organic photoelectric conversion layer 17 in the effective pixel region 1B is represented by a sum of the film stress of the upper electrode 18 and the film stress of the protective film 19. Thus, the following expression 1 is obtained.

(Expression 1)

$$+100+(-500)=-400 \text{ MPa} \quad (1)$$

On the other hand, the sum of film stress on the light-incidence side of the organic photoelectric conversion layer 17 in the OB region 1C except for the buffer film 40 is represented by a sum of the film stress of the upper electrode 18, the protective film 19, and the light-shielding film 30. Thus, the following expression 2 is obtained.

(Expression 2)

$$+100+(-500)+(+500)=+100 \text{ MPa} \quad (2)$$

In order to allow the buffer film 40 to cancel the difference in stress between the OB region 1C and the effective pixel region 1B, it is desirable that (1)−(2)=−500 MPa be applied to the OB region 1C by using the buffer film 40. However, from FIG. 10, an allowance of the difference in stress between the OB region 1C and the effective pixel region 1B is −150 MPa to +200 MPa both inclusive. Therefore, in the case of this example, the film stress of the buffer film 40 may be controlled to be −650 MPa to −300 MPa both inclusive.

Further, the film stress on the light-incidence side in the OB region 1C may be preferably −150 MPa to +200 MPa both inclusive. Moreover, the film stress on the light-incidence side in the effective pixel region 1B may be preferably −150 MPa to +200 MPa both inclusive. In this way, it is possible to allow the difference in stress between the OB region 1C and the effective pixel region 1B to be adjusted to −150 MPa to +200 MPa both inclusive.

The buffer film 40 may be preferably configured of, for example, at least one of a group consisting of SiN (silicon nitride), $SiO_2$ (silicon oxide), SiON (silicon oxinitride), SiC (silicon carbide), SiCN (silicon nitrocarbide), ITO (indium tin oxide), Al (aluminum), and AlO (aluminum oxide).

Otherwise, the organic photoelectric conversion section 11G of the photoelectric conversion element 10C has the same configuration as that of the photoelectric conversion element 10B.

The photoelectric conversion elements 10B and 10C may be manufactured, for example, as follows.

FIGS. 11 to 30 illustrate a method of manufacturing the photoelectric conversion elements 10B and 10C in the order of procedure. It is to be noted that, in FIGS. 19 to 30, only main parts of the photoelectric conversion elements 10B and 10C are represented.

Figure 11:
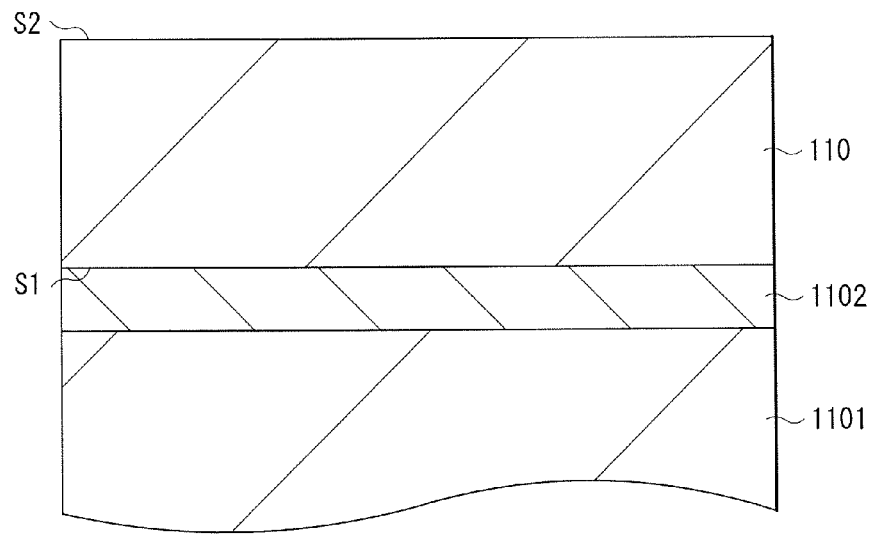
FIG. 11 is a cross-sectional view illustrating a method of manufacturing the photoelectric conversion elements illustrated in FIG. 3 and FIG. 7 in the order of procedure.

First, the semiconductor substrate 11 is formed. Specifically, as illustrated in FIG. 11, prepared is a so-called SOI substrate in which the silicon layer 110 is formed on a silicon base 1101 with a silicon oxide film 1102 in between. It is to be noted that a surface, on the silicon oxide film 1102 side, of the silicon layer 110 serves as the rear surface (the surface S1) of the semiconductor substrate 11. The illustrations of FIGS. 11 to 14 are in an inverted state from the structures illustrated in FIG. 3 or FIG. 7.

Figure 12:
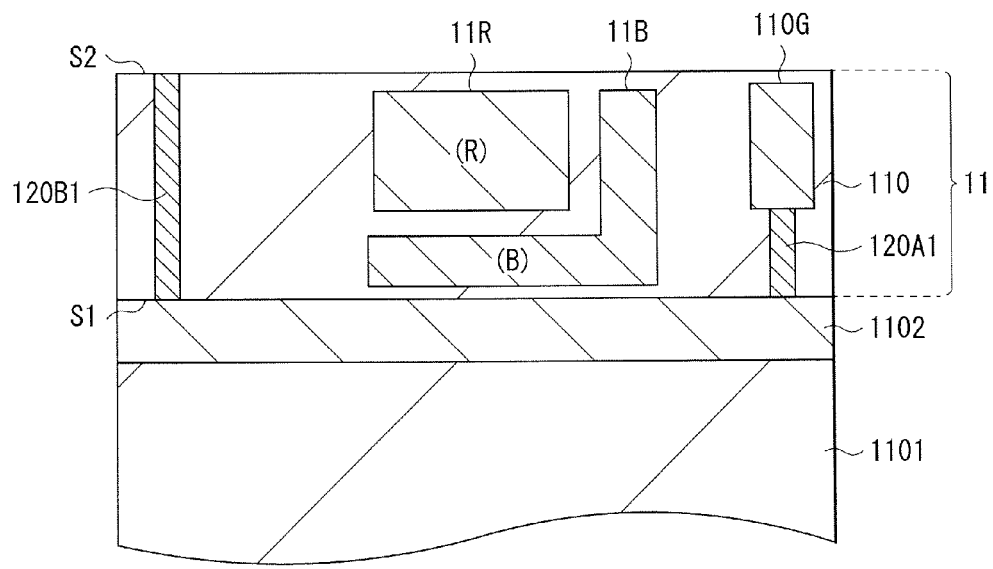
FIG. 12 is a cross-sectional view illustrating a process following FIG. 11.

Next, as illustrated in FIG. 12, the conductive plugs 120A1 and 120B1 are formed in the silicon layer 110. At this occasion, the conductive plugs 120A1 and 120B1 may be formed as follows; for example, through-vias are formed in the silicon layer 110, and then, the above-mentioned barrier metals such as silicon nitride and tungsten are filled in the through-vias. Alternatively, a conductive impurity semiconductor layer may be formed by, for example, ion implantation into the silicon layer 110. In this case, the conductive plug 120A1 may be formed as an n-type semiconductor layer while the conductive plug 120B1 may be formed as a p-type semiconductor layer. Thereafter, in regions of different depths in the silicon layer 110 (so that the regions overlap one another), the inorganic photoelectric conversion sections 11B and 11R that each include, for example, p-type regions and n-type regions as illustrated in FIGS. 4 and 5 are formed by ion implantation. Moreover, in an adjacent region to the conductive plug 120A1, the storage layer for green 110G is formed by ion implantation. In this way, the semiconductor substrate 11 is formed.

It is to be noted that thereafter, although not illustrated, on the surface S2 side of the semiconductor substrate 11, the pixel transistors including the transfer transistors Tr1 to Tr3 and the peripheral circuit section 130 are formed.

Figure 13:
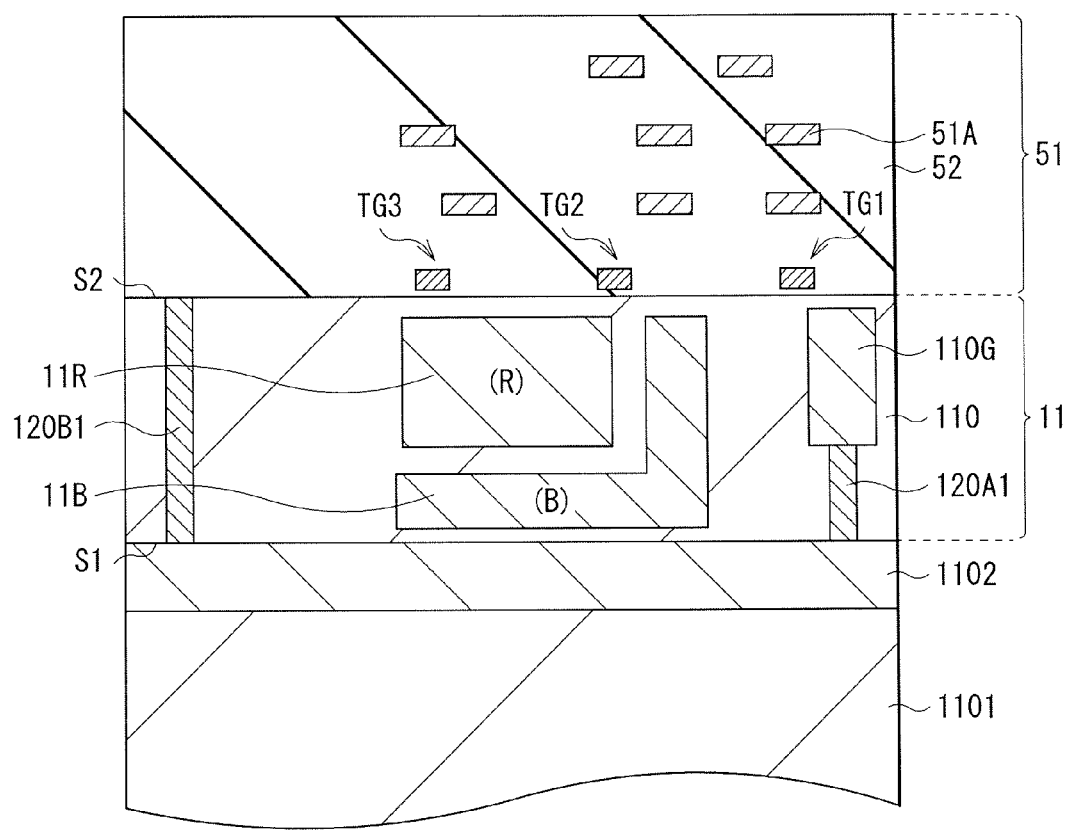
FIG. 13 is a cross-sectional view illustrating a process following FIG. 12.

Subsequently, as illustrated in FIG. 13, on the surface S2 side of the semiconductor substrate 11, the plurality of layers of the wires 51A are formed with the interlayer insulating layer 52 in between. Thus, the multi-layered wiring layer 51 is formed.

Figure 14:
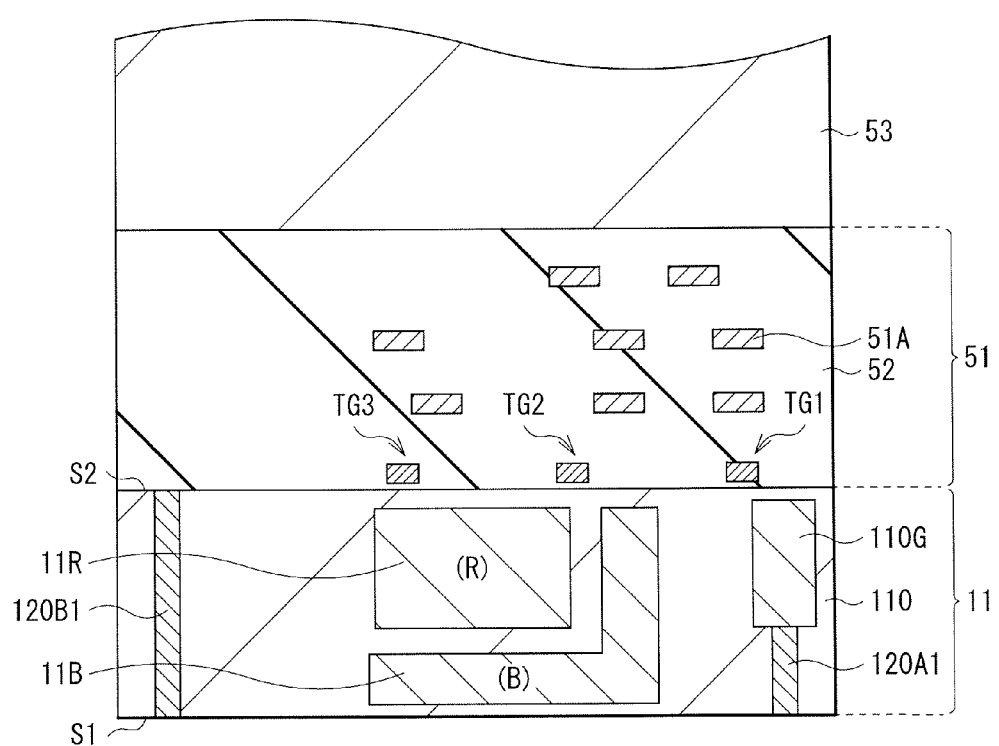
FIG. 14 is a cross-sectional view illustrating a process following FIG. 13.

Then, as illustrated in FIG. 14, the support substrate 53 made of silicon is bonded onto the multi-layered wiring layer 51. Thereafter, the silicon base 1101 and the silicon oxide film 1102 are peeled off from the surface S1 side of the semiconductor substrate 11, to allow the surface 51 of the semiconductor substrate 11 to be exposed.

Figure 15:
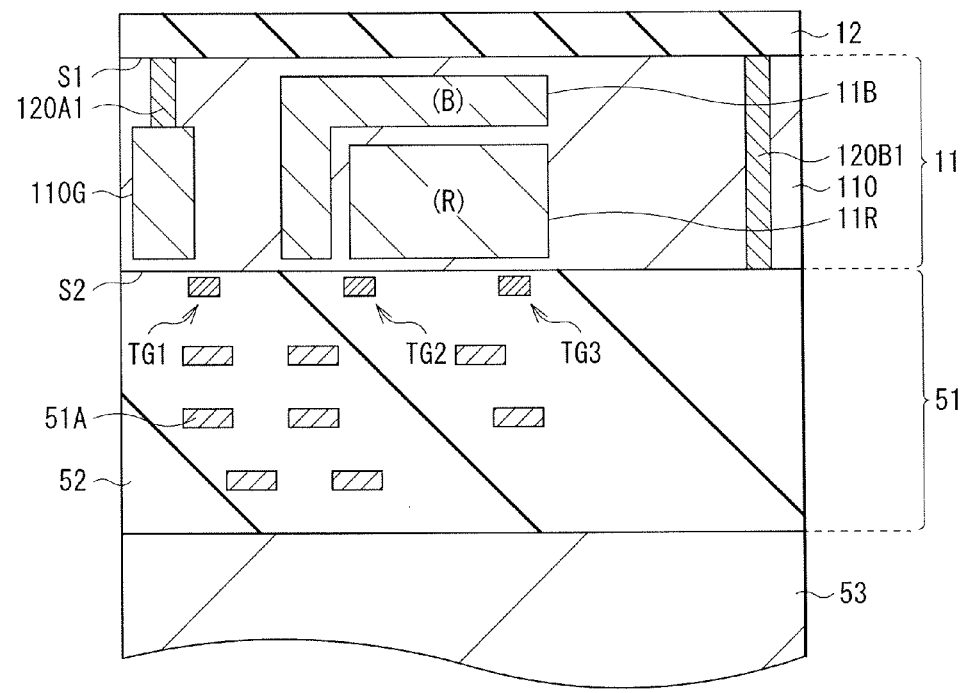
FIG. 15 is a cross-sectional view illustrating a process following FIG. 14.

After bonding the support substrate 53 to the multi-layered wiring layer 51, the organic photoelectric conversion section 11G is formed on the surface S1 of the semiconductor substrate 11. Specifically, first, as illustrated in FIG. 15, on the surface S1 of the semiconductor 11, the interlayer insulating film 12 that is configured of a stacked film of a hafnium oxide film and a silicon oxide film as mentioned above is formed.

For example, the hafnium oxide film is deposited by an ALD (Atomic Layer Deposition) method, and then for example, the silicon oxide film is deposited by plasma CVD (Chemical Vapor Deposition). However, constituent materials and deposition methods of the interlayer insulating film 12 are not particularly limited.

Figure 16:
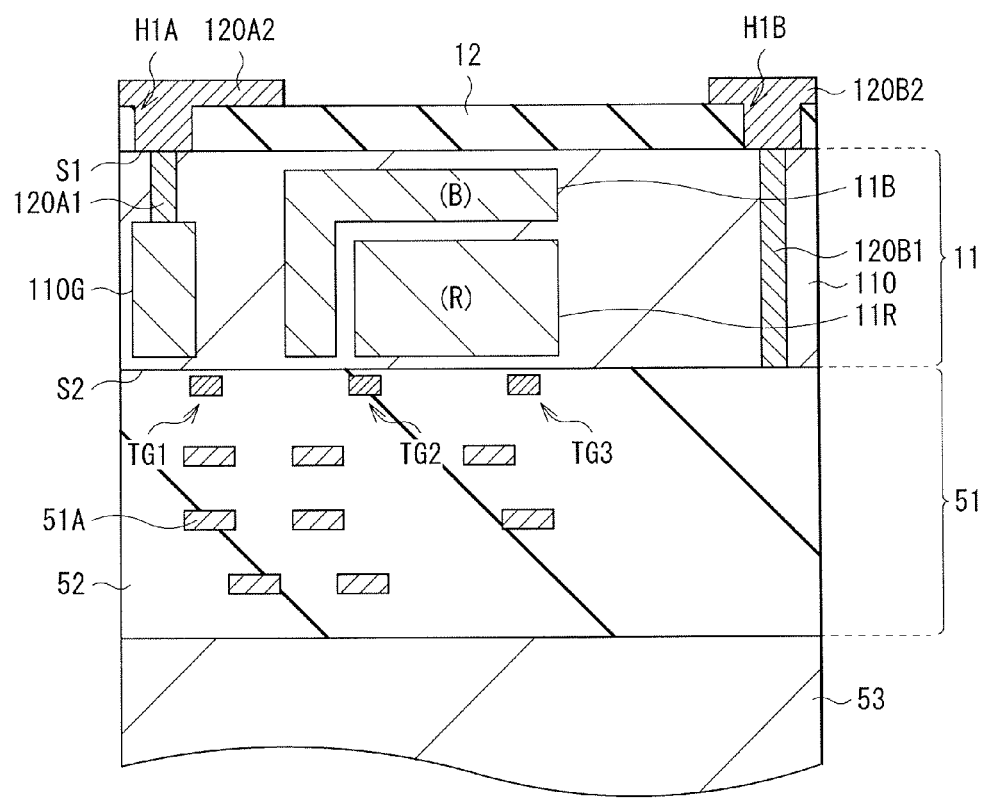
FIG. 16 is a cross-sectional view illustrating a process following FIG. 15.

After forming the interlayer insulating film 12, as illustrated in FIG. 16, contact holes H1A and H1B are provided in the interlayer insulating film 12 at positions that face the conductive plugs 120A1 and 120B1. The contact holes H1A and H1B are filled with the conductive plugs 120A2 and 120B2 that are configured of the above-mentioned materials. At this occasion, the conductive plugs 120A2 and 120B2 may be extended from inside the contact holes H1A and H1B to an upper surface of the interlayer insulating film 12, to cover a region where light-shielding is desired over the interlayer insulating film 12. Alternatively, on a region over the interlayer insulating film 12, which is separated from the conductive plugs 120A2 and 120B2, an additional light-shielding layer (not illustrated) may be formed.

Figure 17:
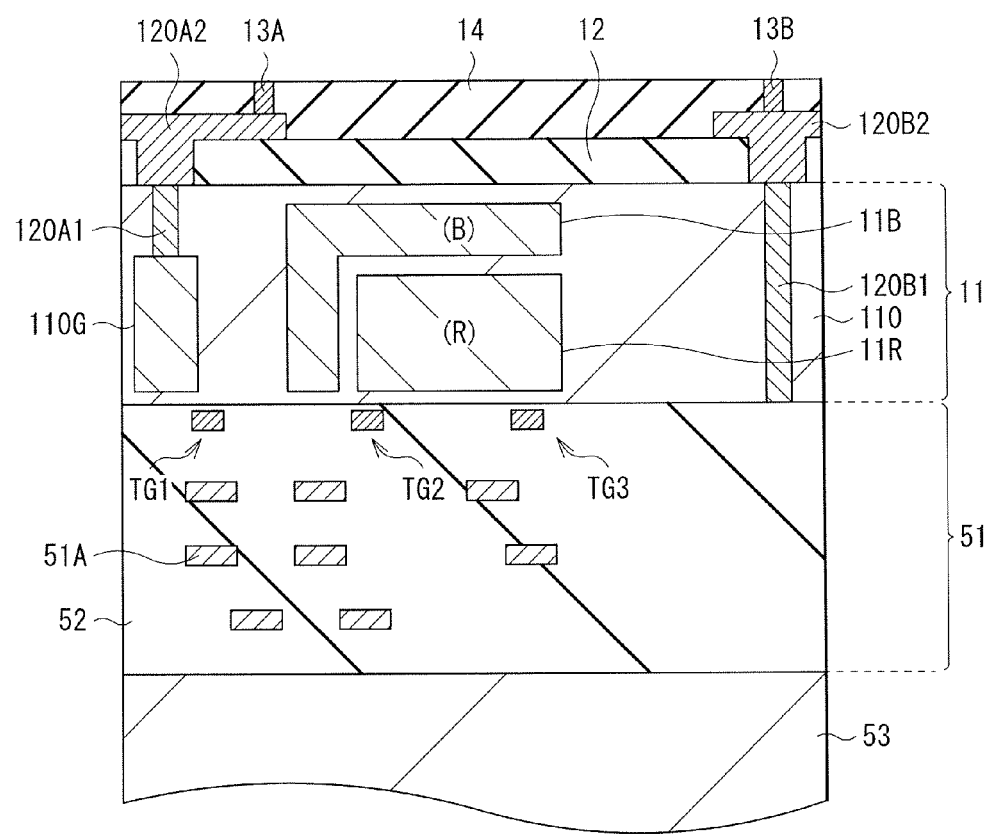
FIG. 17 is a cross-sectional view illustrating a process following FIG. 16.

After forming the conductive plugs 120A2 and 120B2, as illustrated in FIG. 17, the interlayer insulating film 14 that is configured of the above-mentioned materials is deposited by, for example, a plasma CVD method. It is to be noted that, after deposition, it is desirable that a surface of the interlayer insulating film 14 be planarized by, for example, a CMP (Chemical Mechanical Polishing) method. Subsequently, contact holes are opened in the interlayer insulating film 14 at positions that face the conductive plugs 120A2 and 120B2. In the contact holes, the wiring layers 13A and 13B that are configured of the above-mentioned materials are formed. The wiring layers 13A and 13B may be formed as follows; for example, a stacked film of a TiN film and a W film is formed, and then, using, for example, a CMP method, surplus wiring-layer materials (such as TiN and W) over the interlayer insulating film 14 are removed.

Figure 18:
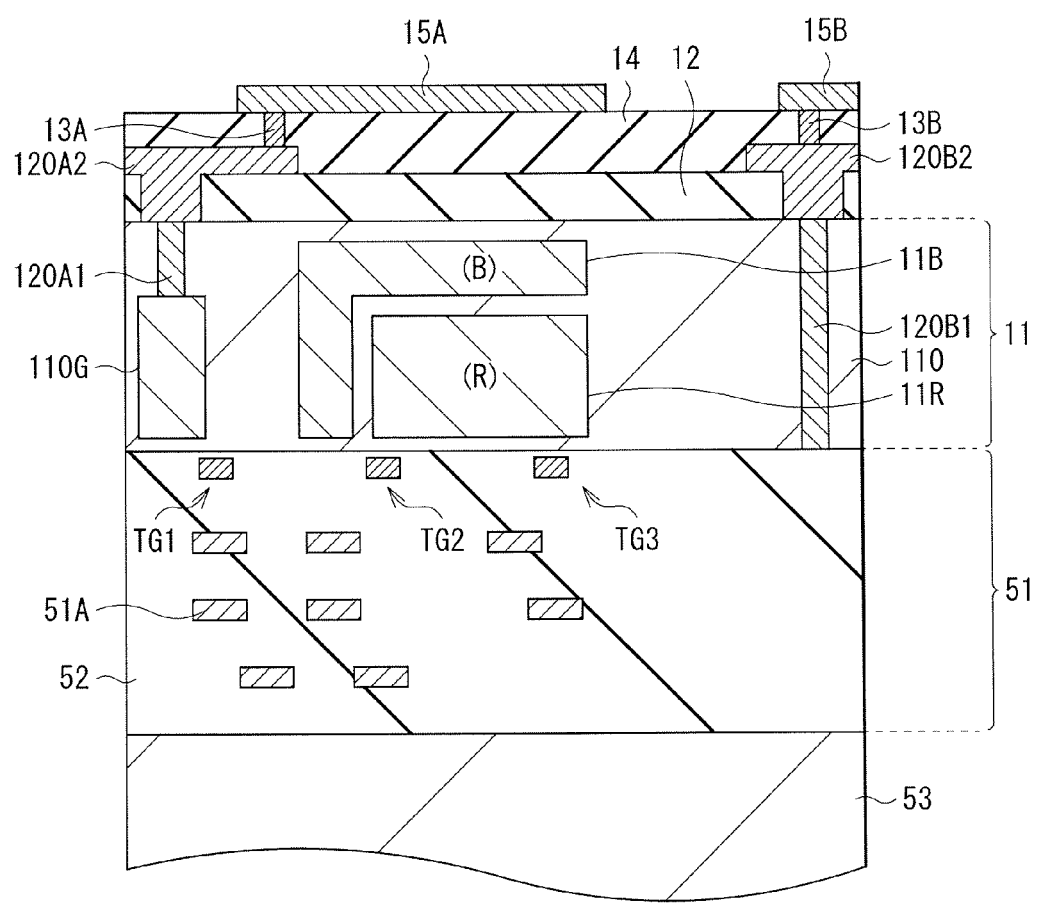
FIG. 18 is a cross-sectional view illustrating a process following FIG. 17.

After forming the interlayer insulating film 14, and the wiring layers 13A and 13B, as illustrated in FIG. 18, the lower electrode 15A is formed on the interlayer insulating film 14. Specifically, first, over the entire surface of the interlayer insulating film 14, by, for example, a sputtering method, a transparent conductive film (not illustrated) configured of the above-mentioned material such as ITO is deposited. Thereafter, patterning is carried out using photolithography, and then the transparent conductive film is processed using, for example, dry etching or wet etching. At this occasion, the lower electrode 15A is formed in a region that faces the wiring layer 13A. Moreover, in processing the transparent conductive film, the transparent conductive film is allowed to remain in a region that faces the wiring layer 13B. Thus, the wiring layer 15B that constitutes a part of a transfer route of holes is formed at the same time as the lower electrode 15A.

Figure 19:
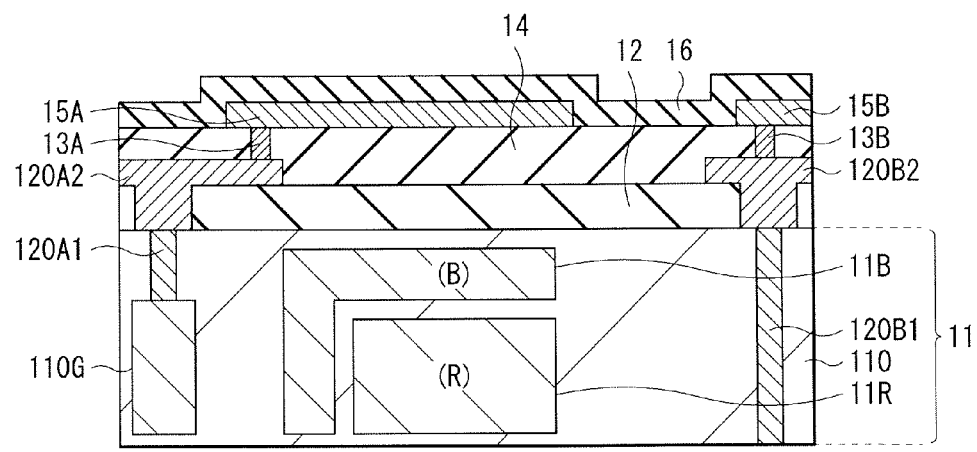
FIG. 19 is a cross-sectional view illustrating a process following FIG. 18.
Figure 20:
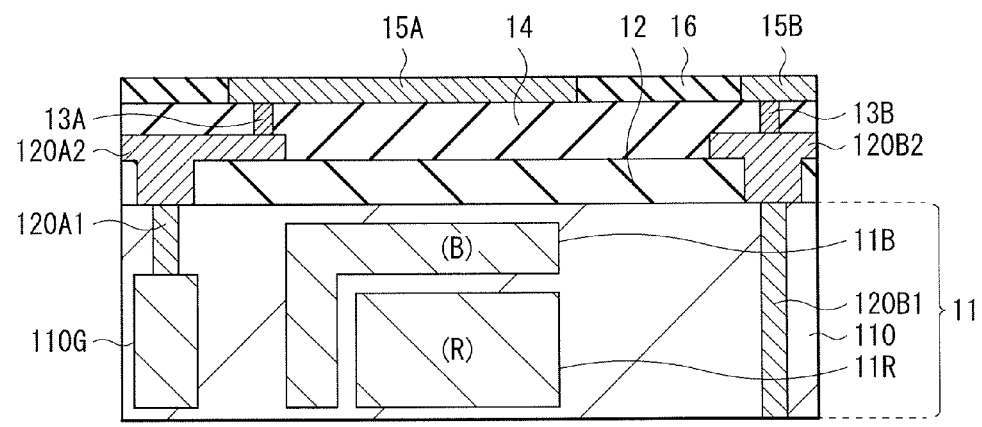
FIG. 20 is a cross-sectional view illustrating a process following FIG. 19.

After forming the lower electrode 15A and the wiring layer 15B, the insulating film 16 is formed. At this occasion, first, as illustrated in FIG. 19, over the entire surface of the semiconductor substrate 11, the insulating film 16 configured of the above-mentioned materials is deposited by, for example, a plasma CVD method, to cover the interlayer insulating film 14, the lower electrode 15A, and the wiring layer 15B. Next, as illustrated in FIG. 20, the insulating film 16 thus deposited is polished by, for example, a CMP method, to allow the lower electrode 15A and the wiring layer 15B to be exposed from the insulating film 16. At this occasion, the insulating film 16 is retreated so that the insulating film 16 is thinner than the lower electrode 15A and the wiring layer 15B.

Figure 21:
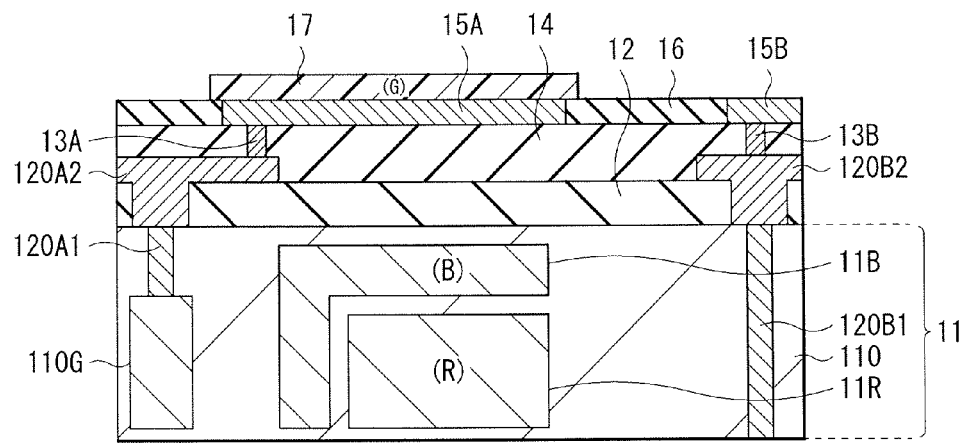
FIG. 21 is a cross-sectional view illustrating a process following FIG. 20.

After forming the insulating film 16, as illustrated in FIG. 21, on the lower electrode 15A, the organic photoelectric conversion layer 17 is formed. At this occasion, a photoelectric conversion material configured of the above-mentioned materials is formed in a pattern by, for example, a vacuum evaporation method using a metal mask. For example, a quinacridone derivative may be deposited by a vacuum evaporation method. It is to be noted that, as described above, in forming other organic layers (such as the electron blocking layer) below or above the organic photoelectric conversion layer 17, it is desirable that the layers be formed, using the same metal mask, continuously in a vacuum process (by a vacuum integrated process). Moreover, a deposition method of the organic photoelectric conversion layer 17 is not limited to the above-mentioned method using a metal mask, but other techniques, for example, a printing technology and so forth may be also used.

Figure 22:
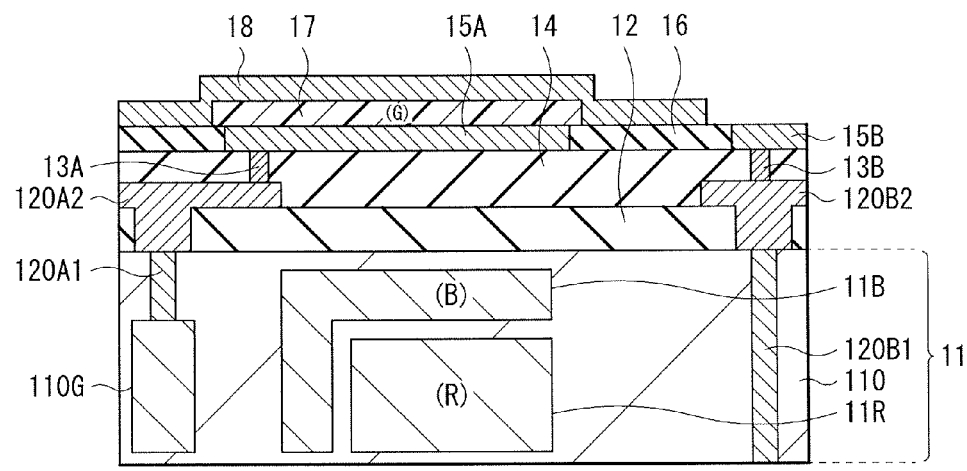
FIG. 22 is a cross-sectional view illustrating a process following FIG. 21.

After forming the organic photoelectric conversion layer 17, as illustrated in FIG. 22, the upper electrode 18 is formed. First, an upper electrode material film (not illustrated) that is configured of the above-mentioned transparent conductive material is deposited over the entire surface of the semiconductor substrate 11 by, for example, a vacuum evaporation method or a sputtering method, to cover an upper surface and side surfaces of the organic photoelectric conversion layer 17. It is to be noted that, in the organic photoelectric conversion layer 17, characteristics is liable to fluctuate due to influences by moisture, oxygen, or hydrogen, and it is desirable that the upper electrode material film be deposited by a vacuum integrated process with the organic photoelectric conversion layer 17. Next, a photoresist film is deposited on the upper electrode material film, and the photoresist film is patterned in a predetermined shape. Subsequently, by dry etching using the photoresist film as a mask, the upper electrode material film is processed to form the upper electrode 18.

Figure 23:
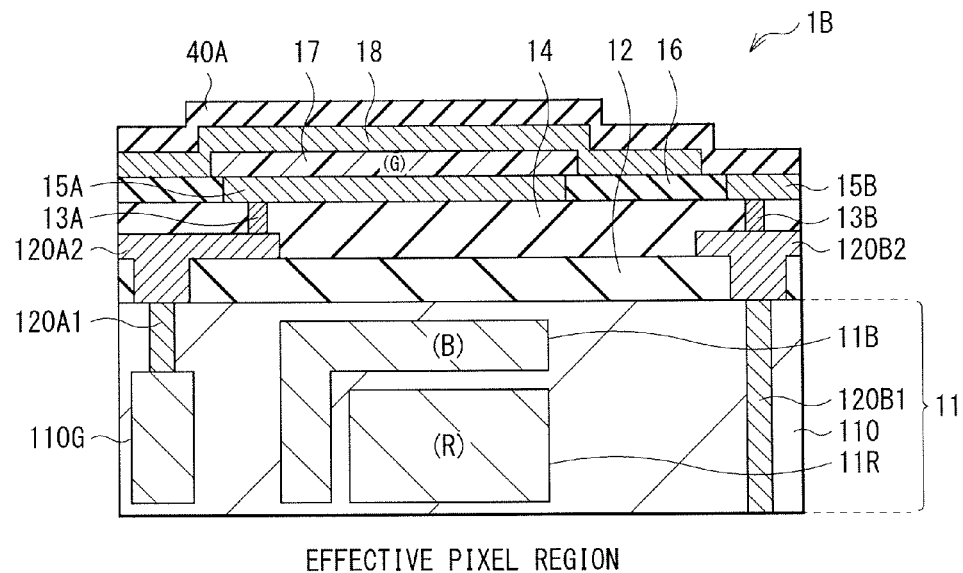
FIG. 23 is a cross-sectional view illustrating a process following FIG. 22 in the effective pixel region.
Figure 24:
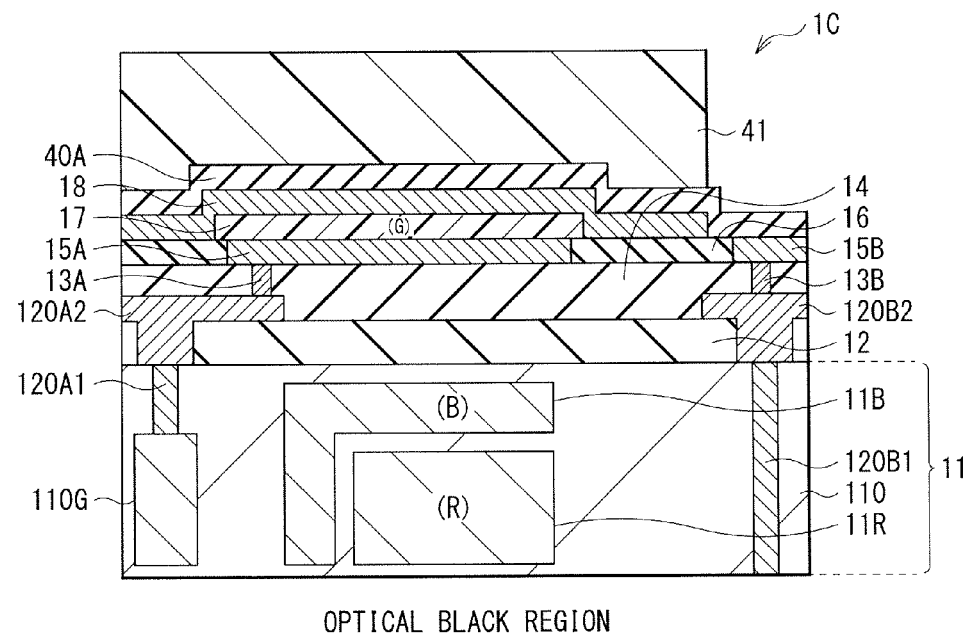
FIG. 24 is a cross-sectional view illustrating a process following FIG. 22 in the optical black region.

After forming the upper electrode 18, as illustrated in FIGS. 23 and 24, both in the effective pixel region 1B and in the OB region 1C, a buffer material film 40A configured of the above-mentioned materials is formed over the entire surface. Subsequently, as illustrated in FIG. 24 as well, a resist pattern 41 is formed in the OB region 1C. At this occasion, the resist pattern 41 is supposed be formed on the buffer material film 40A in the OB region 1C. It is to be noted that, in FIGS. 23 to 30, the same process is represented separately for the effective pixel region 1B and the OB region 1C.

Figure 25:
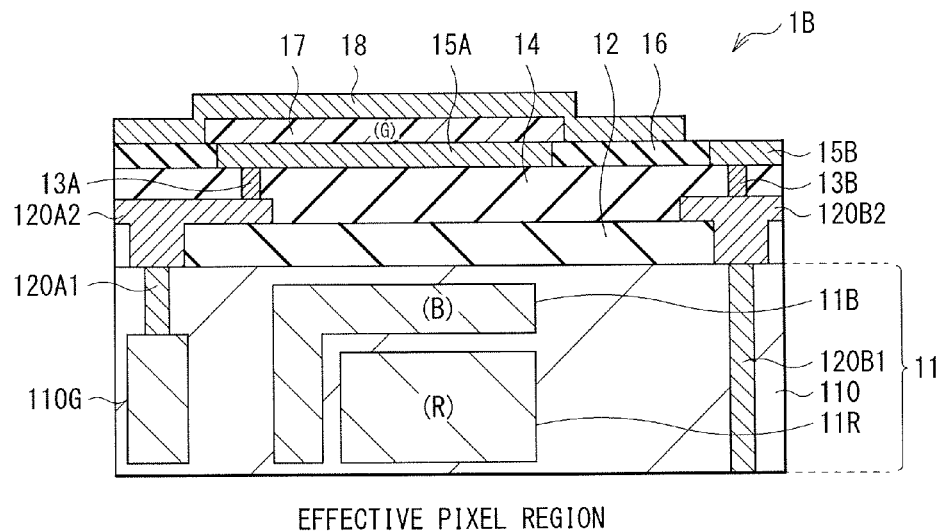
FIG. 25 is a cross-sectional view illustrating a process following FIG. 23 in the effective pixel region.
Figure 26:
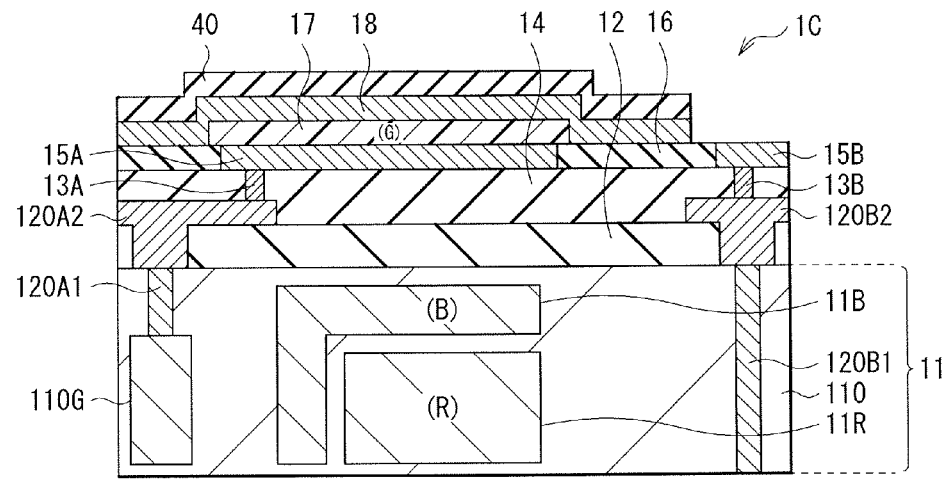
FIG. 26 is a cross-sectional view illustrating a process following FIG. 24 in the optical black region.

After forming the resist pattern 41, as illustrated in FIGS. 25 and 26, by dry etching or the like using the resist pattern 41 as a mask, the buffer material film 40A in the effective pixel region 1B is removed, while at the same time an unnecessary portion of the buffer material film 40A in the OB region 1C is removed. Thus, the buffer film 40 is formed. Thereafter, by ashing and cleaning, the resist pattern 41 is removed.

Figure 27:
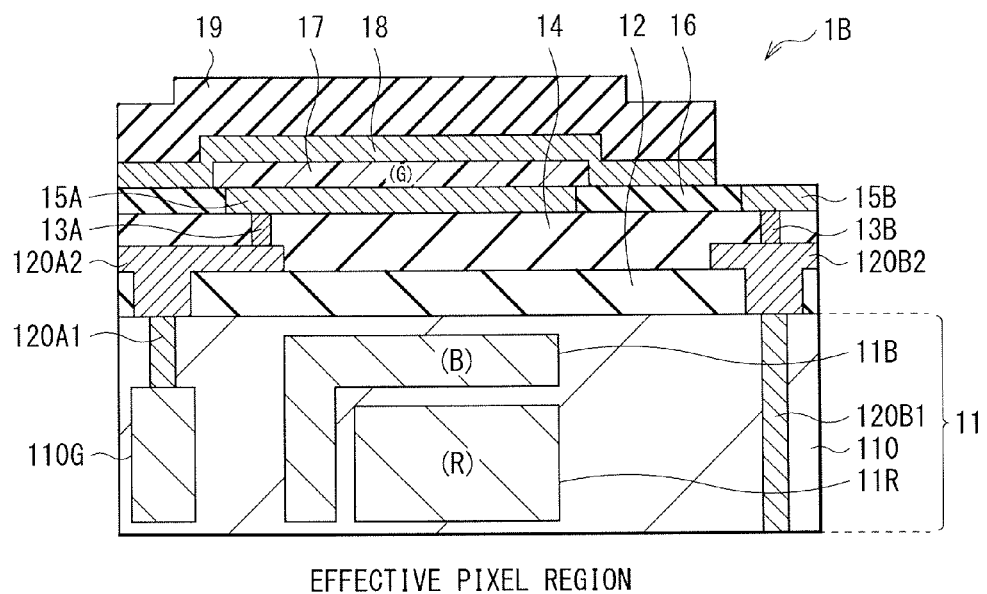
FIG. 27 is a cross-sectional view illustrating a process following FIG. 25 in the effective pixel region.
Figure 28:
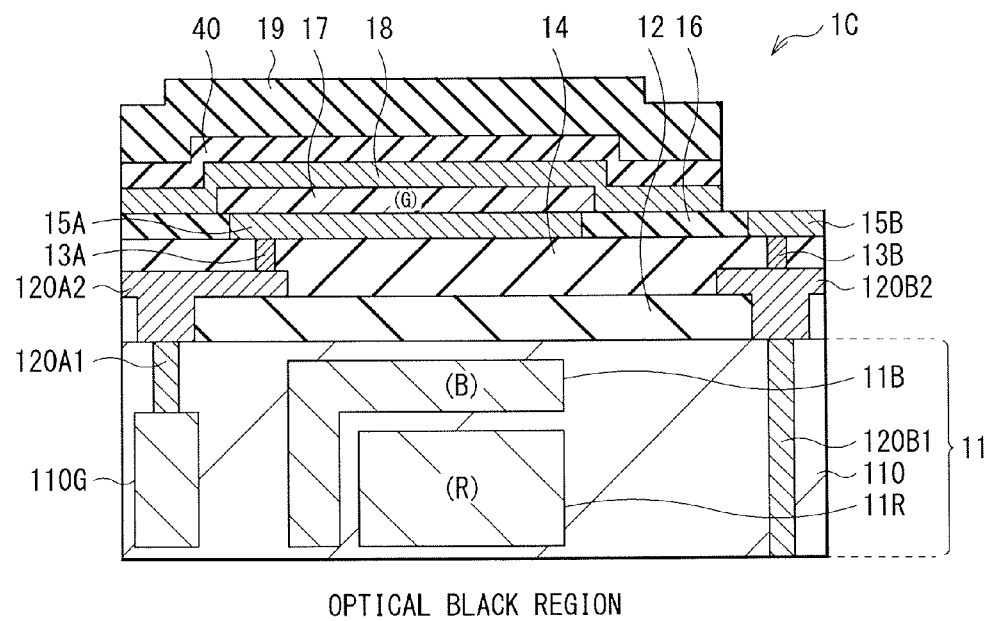
FIG. 28 is a cross-sectional view illustrating a process following FIG. 26 in the optical black region.

After forming the buffer film 40, as illustrated in FIGS. 27 and 28, on the buffer film 40, the protective film 19 configured of the above-mentioned materials is formed. Specifically, a protective-film material film (not illustrated) configured of, for example, SiN is formed over the entire surface, and then the protective-film material film is patterned using a photolithograpy technique, and dry-etched. Postprocessing such as ashing and organic cleaning is carried out to remove deposits and residue.

Figure 29:
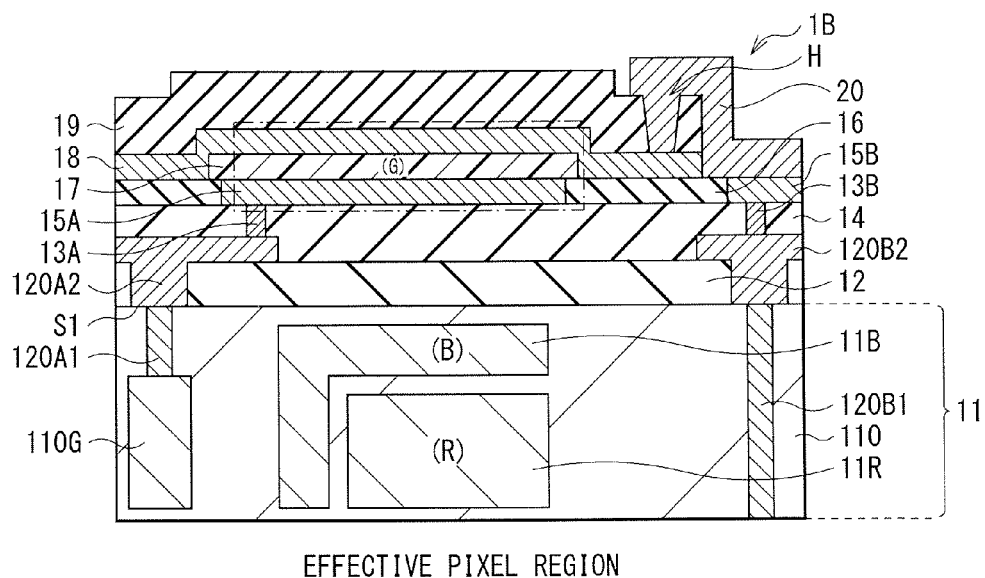
FIG. 29 is a cross-sectional view illustrating a process following FIG. 27 in the effective pixel region.
Figure 30:
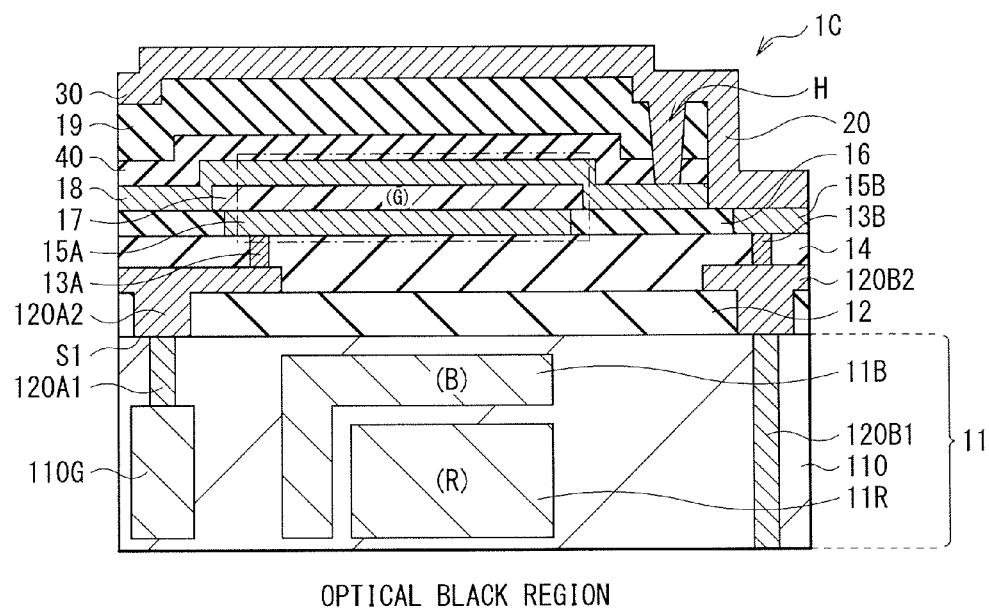
FIG. 30 is a cross-sectional view illustrating a process following FIG. 28 in the optical black region.

After forming the protective film 19, as illustrated in FIGS. 29 and 30, by, for example, dry etching with the use of photolithography, a contact hole H is provided in the protective film 19. Subsequently, by, for example, a sputtering method, the contact metal layer 20 is formed in the effective pixel region 1B, while at the same time the contact metal layer 20 and the light-shielding film 30 are formed in the OB regin 1C. It is to be noted that, in the effective pixel region 1B, the contact metal layer 20 is formed on the protective film 19, to fill in the contact hole H and to extend to an upper surface of the wiring layer 15b.

Finally, although not illustrated, over the entire surface of the semiconductor substrate 11, the planarization film 21 is formed, following which, the on-chip lens 22 is formed on the planarization film 21. Thus, the photoelectric conversion element 10B as illustrated in FIG. 3 and the photoelectric conversion element 1C as illustrated in FIG. 7 are completed.

Figure 31:
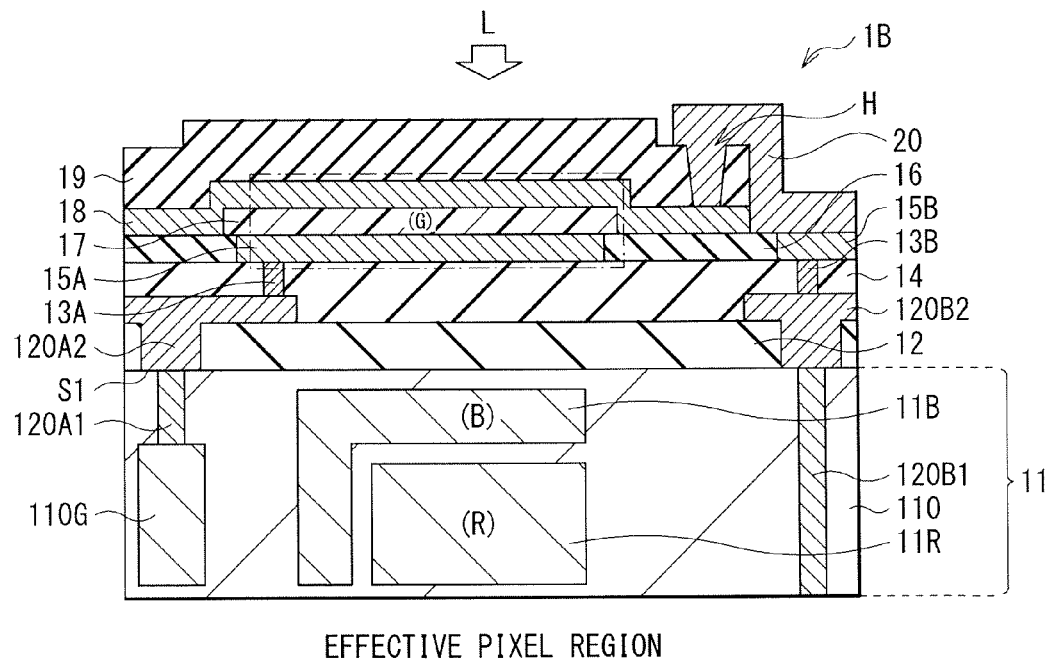
FIG. 31 is a cross-sectional view illustrating a main part of the photoelectric conversion element illustrated in FIG. 3, for explaining functions thereof.

In the solid-state image pickup device 1, for example, as illustrated in FIG. 31, when light L enters the photoelectric conversion element 10B in the effective pixel region 1B through the on-chip lens 22 (not illustrated in FIG. 31), the light L passes through the organic photoelectric conversion section 11G, and the inorganic photoelectric conversion sections 11B and 11R in this order. In the process of passing therethrough, the light L is subjected to photoelectric conversion for each color light of red, green, and blue. On the other hand, in the OB region 1C, the light L is prevented from entering the photoelectric conversion element 10C by the light-shielding film 30.

Figure 32:
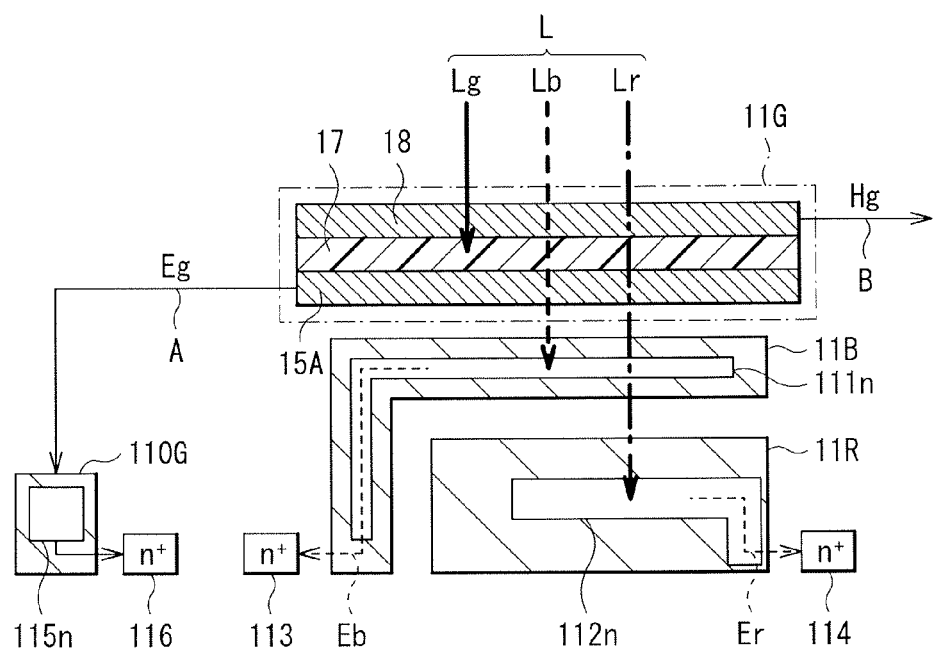
FIG. 32 is a schematic diagram for explaining functions of the photoelectric conversion element illustrated in FIG. 3.

FIG. 32 schematically illustrates a flow of obtaining signal charges (electrons) based on the incident light. In the following, description will be given on specific operations of obtaining signals in the respective photoelectric conversion sections.

(Obtaining Green Color Signal by Organic Photoelectric Conversion Section 11G)

In the light L entering the photoelectric conversion element 10, first, green light Lg is selectively detected (absorbed) in the organic photoelectric conversion section 11G and is subjected to photoelectric conversion. Thus, out of electron-hole pairs generated, electrons Eg are extracted from the lower electrode 15A, and then accumulated in the storage layer for green 110G through a transfer route A (the wiring layer 13A, and the conductive plugs 120A1 and 120A2). The electrons Eg thus accumulated are transferred to the FD 116 in a read-out operation. It is to be noted that holes Hg are discharged from the upper electrode 18 side through a transfer route B (the contact metal layer 20, the wiring layers 13B and 15B, and the conductive plugs 120B1 and 120B2).

Specifically, signal charges may be accumulated as follows. That is, in the present embodiment, for example, a predetermined negative potential VL (<0 V) is applied to the lower electrode 15A, while a potential VU lower than the potential VL (<VL) is applied to the upper electrode 18. It is to be noted that the potential VL is supplied to the lower electrode 15A from, for example, the wiring 51A in the multi-layered wiring layer 51 through the transfer route A. The potential VL is supplied to the upper electrode 18 from the wiring 51A in the multi-layered wiring layer 51 through the transfer route B. Thus, in a charge accumulation state (an OFF state of the undepicted reset transistor and the transfer transistor Tr1), out of the electron-hole pairs generated in the organic photoelectric conversion layer 17, electrons are led toward the lower electrode 15A side having a relatively high potential (holes are led toward the upper electrode 18 side). Thus, electrons Eg are extracted from the lower electrode 15A and accumulated in the storage layer for green 110G (specifically, the n-type region 115n) through the transfer route A. Moreover, by this accumulation of electrons Eg, the potential VL of the lower electrode 15A that is conductive with the storage layer for green 110G also varies. An amount of variation of the potential VL corresponds to a signal potential (here, a potential of a green signal).

Then, in the read-out operation, the transfer transistor Tr1 is turned on, and the electrons Eg accumulated in the storage layer for green 110G are transferred to the FD 116. Thus, the green signal based on an amount of the green light Lg received is read out to the vertical signal line Lsig through undepicted other pixel transistors. Thereafter, the undepicted reset transistor and the transfer transistor Tr1 is turned on, and the FD 116 as an n-type region and an accumulation region of the storage layer for green 110G (the n-type region 115n) are reset to, for example, a supply voltage VDD.

(Obtaining Blue Signal and Red Signal by Inorganic Photoelectric Conversion Sections 11B and R)

Subsequently, out of light that has passed through the organic photoelectric conversion section 11G, blue light and red light are absorbed by the inorganic photoelectric conversion sections 11B and 11R, respectively, in this order, and are subjected to photoelectric conversion. In the inorganic photoelectric conversion section 11B, electrons Eb that correspond to incident blue light are accumulated in the n-type region (the n-type photoelectric conversion layer 111n). The accumulated electrons Ed are transferred to the FD 113 in the read-out operation. It is to be noted that holes are accumulated in the undepicted p-type region. Similarly, in the inorganic photoelectric conversion section 11R, electrons Er that correspond to incident red light are accumulated in the n-type region (the n-type photoelectric conversion layer 112n). The accumulated electrons Er are transferred to the FD 114 in the read-out operation. It is to be noted that holes are accumulated in the undepicted p-type region.

In the charge accumulation state, as mentioned above, the negative potential VL is applied to the lower electrode 15A of the organic photoelectric conversion section 11G Therefore, a hole concentration in the p-type region (the p-type region 111p in FIG. 4) as a hole accumulation layer of the inorganic photoelectric conversion section 11B tends to increase. Accordingly, it is possible to restrain occurrence of dark currents at an interface between the p-type region 111p and the interlayer insulating layer 12.

In the read-out operation, similarly to the above-mentioned organic photoelectric conversion section 11G, the transfer transistors Tr2 and Tr3 are turned on, and the electrons Eb and Er accumulated in the n-type photoelectric conversion layers 111n and 112n, respectively, are transferred to the FDs 113 and 114. Thus, a blue signal based on an amount of the blue light Lb received and a red signal based on an amount of the red light Lr received are read out to the vertical signal line Lsig through the undepicted other pixel transistors. Thereafter, the undepicted reset transistor and the transfer transistors Tr2 and Tr3 are turned on, and the FDs 113 and 114 as n-type regions are reset to, for example, the supply voltage VDD.

As described above, by vertically stacking the organic photoelectric conversion section 11G, and the inorganic photoelectric conversion sections 11B and 11R, it is possible to separate and detect color lights of red, green, and blue without providing color filters, and to obtain signal charges for each color. Thus, it is possible to restrain optical loss (lowered sensitivity) due to absorption of color light by the color filters or occurrence of false color accompanying pixel interpolation processing.

Moreover, the organic photoelectric conversion section 11G of the photoelectric conversion element 10C in the OB region 1C is provided with the light-shielding film 30 and the buffer film 40 on the light-incidence side. Accordingly, an increase in dark currents in the OB region 1C due to film stress of the light-shielding film 30 is restrained, as compared to the effective pixel region 1B.

As described above, in the present embodiment, the organic photoelectric conversion section 11C of the photoelectric conversion element 10C in the OB region 1C is provided with the light-shielding film 30 and the buffer film 40 on the light-incidence side. Hence, it is possible to relieve a difference in stress between the effective pixel region 1B and the OB region 1C due to film stress of the light-shielding film 30, leading to enhancement of image quality.

Next, description will be given on modification examples (modification examples 1 to 5) of the photoelectric conversion elements 10B and 10C according to the above-described example embodiment. In the following, similar components to those of the above-described example embodiment will be denoted by similar references, and description thereof will be appropriately omitted.

MODIFICATION EXAMPLES 1 to 3

Figure 33:
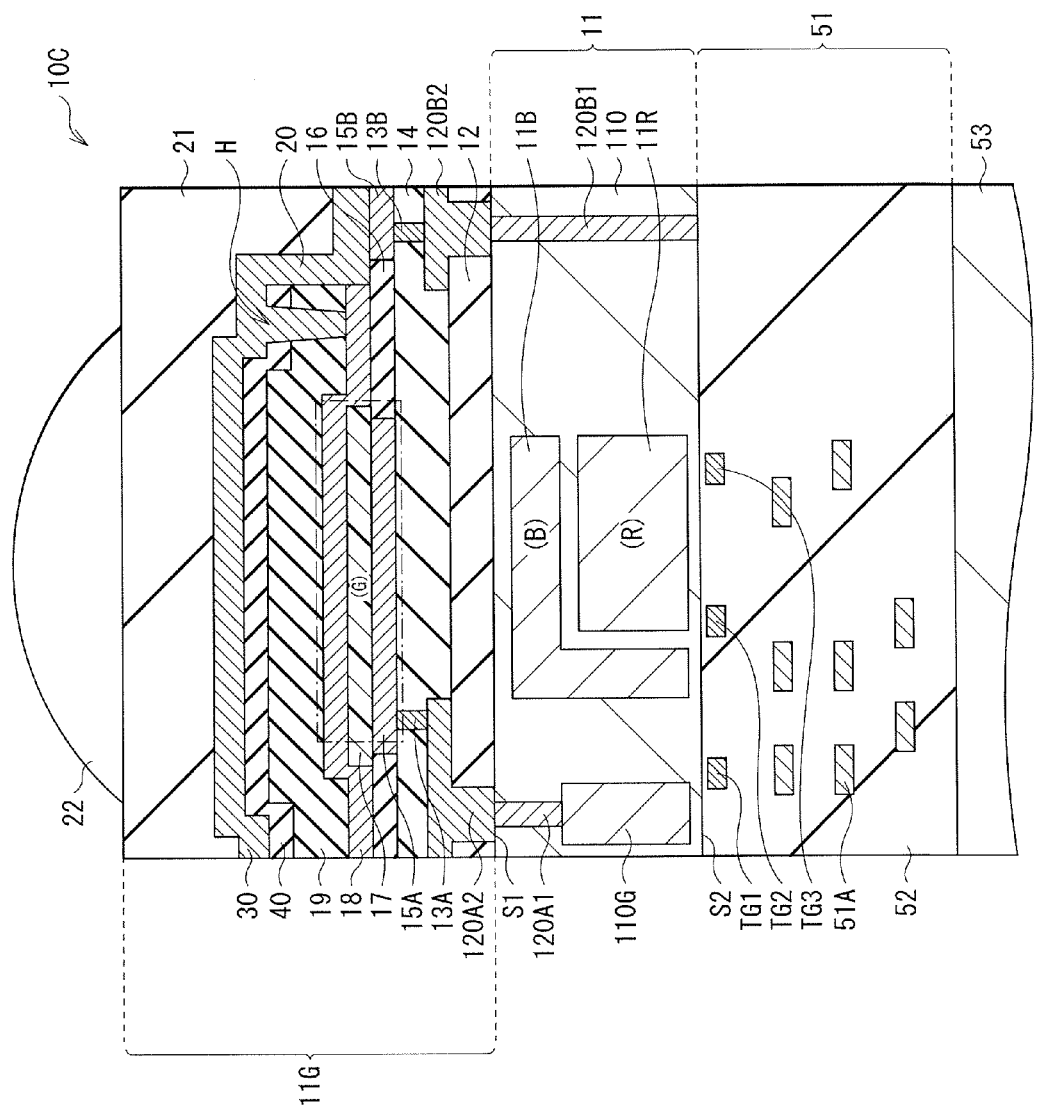
FIG. 33 is a cross-sectional view illustrating a configuration of a photoelectric conversion element according to a modification example 1.
Figure 34:
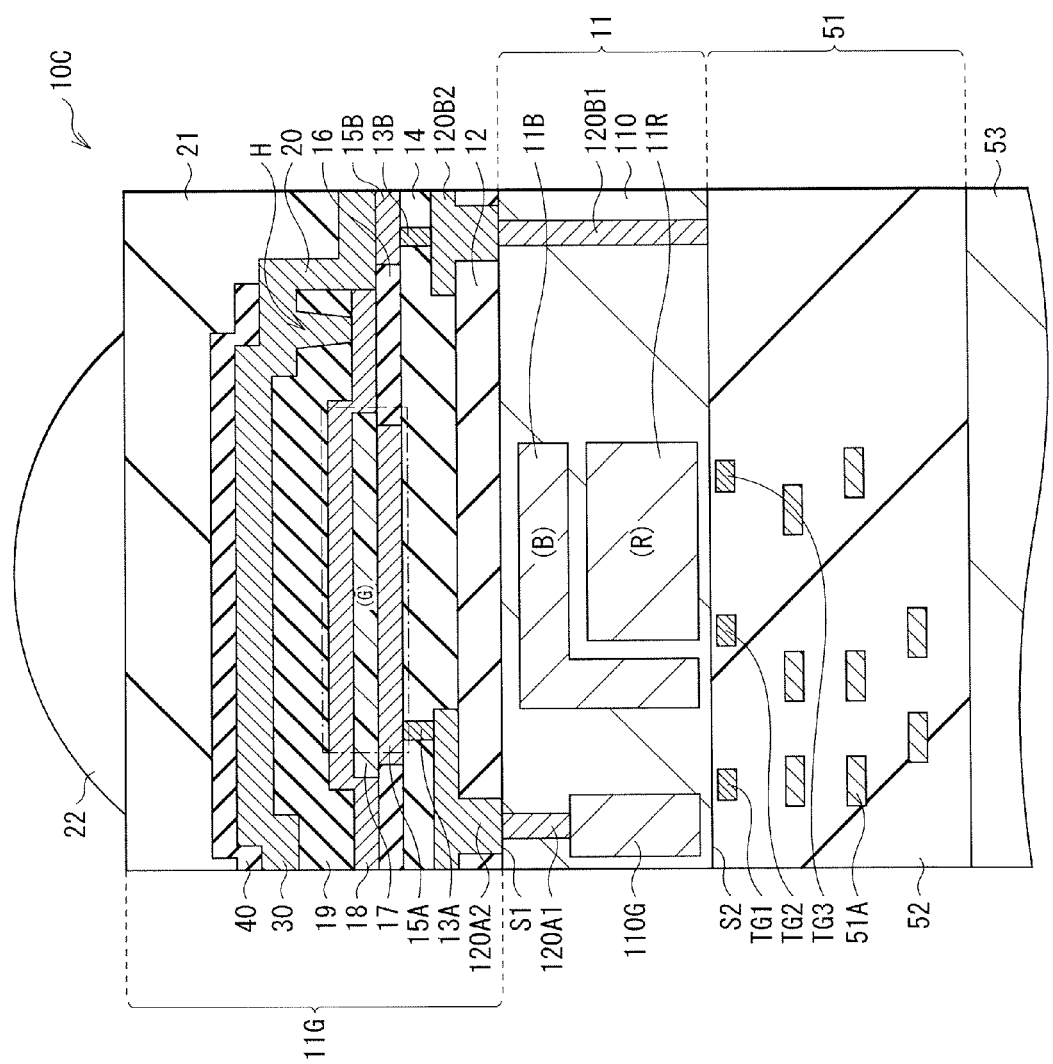
FIG. 34 is a cross-sectional view illustrating a configuration of a photoelectric conversion element according to a modification example 2.
Figure 35:
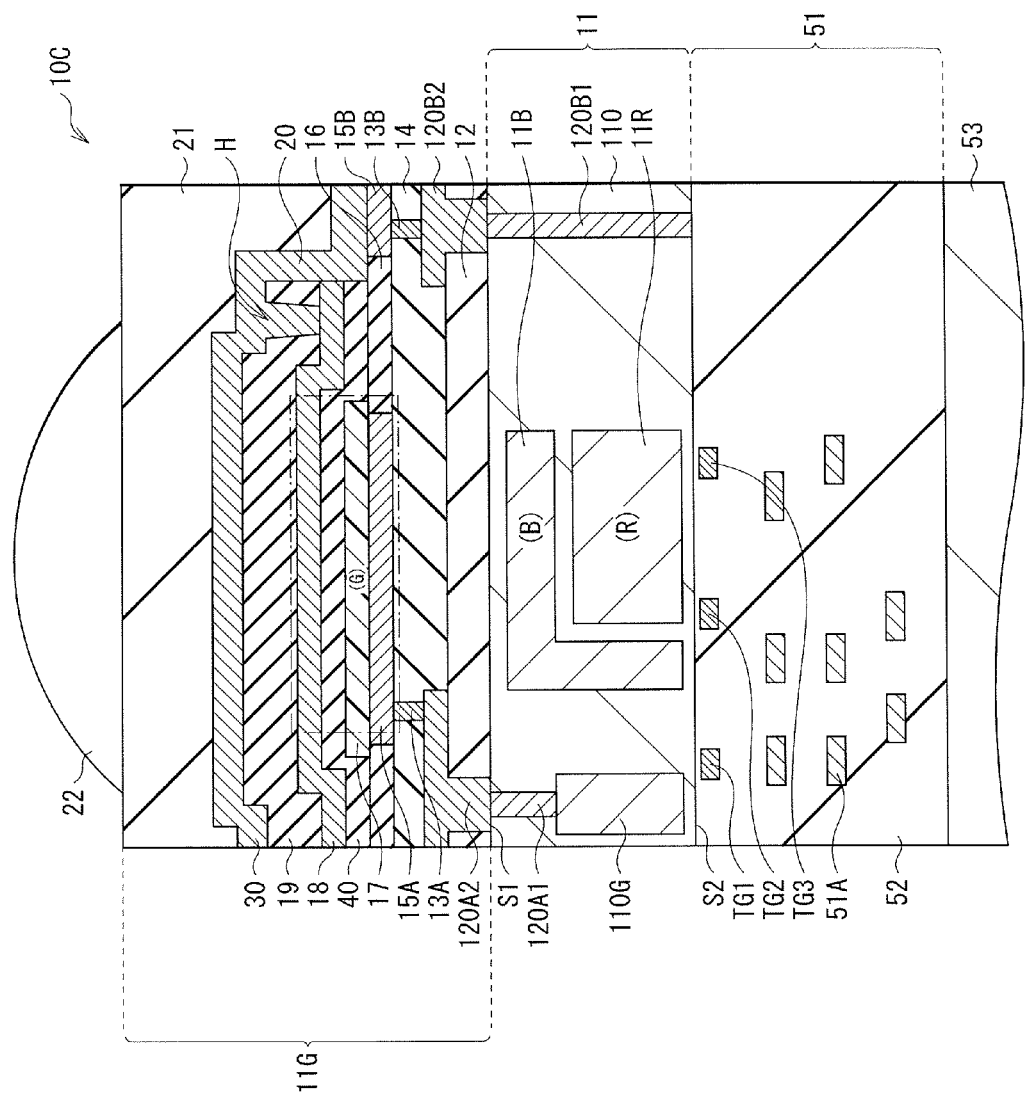
FIG. 35 is a cross-sectional view illustrating a configuration of a photoelectric conversion element according to a modification example 3.

In the above-described example embodiment, description has been given on a case that the buffer film 40 is provided between the upper electrode 18 and the protective film 19. However, the position of the buffer film 40 in the stacking direction is not particularly limited as long as the buffer film 40 is provided on the light-incidence side in the organic photoelectric conversion section 11C. For example, as illustrated in FIG. 33, the buffer film 40 may be provided between the protective film 19 and the light-shielding film 30. Alternatively, as illustrated in FIG. 34, the buffer film 40 may be provided on the light-incidence side of the light-shielding film 30 (between the light-shielding film 30 and the planarization film 21). In another alternative, as illustrated in FIG. 35, the buffer film 40 may be provided between the organic photoelectric conversion layer 17 and the upper electrode 18.

MODIFICATION EXAMPLE 4

Figure 36:
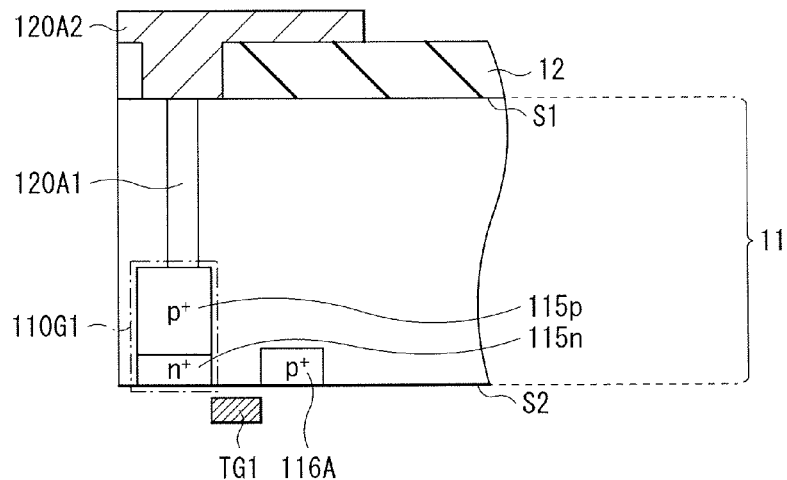
FIG. 36 is a cross-sectional view illustrating a photoelectric conversion element (extraction of holes from the lower side) according to a modification example 4.

FIG. 36 illustrates a configuration of a main part (a part of the semiconductor substrate 11) of a photoelectric conversion element according to a modification example 4. In the above-described example embodiment, description has been given on a case that, in the organic photoelectric conversion section 11G, electrons are extracted as signal charges from the lower electrode 15A. However, a configuration in which holes are extracted as signal charges from the lower electrode 15A may be also possible. In this case, a configuration above the surface S1 of the semiconductor substrate 11 may be similar to that of the above-described example embodiment. However, configurations of a storage layer (a storage layer for green 110G1) formed in the semiconductor substrate 11 and a floating diffusion (an FD 116A) are different. That is, in the storage layer for green 110G1, a p-type region 115$p$ as a hole-accumulation layer is connected to the conductive plug 120A1. In the vicinity of an interface between the p-type region 115$p$ and the surface S2, an n-type region 115$n$ as an electron-accumulation layer is formed. Moreover, the FD 116A is formed as a p-type region. It is to be noted that, in the charge accumulation state, the voltage VL lower than that of the upper electrode 18 is applied to the lower electrode 15A. In this way, out of the electron-hole pairs generated in the organic photoelectric conversion layer 17, holes are led to the lower electrode 15A side, and holes are extracted from the lower electrode 15A. The holes are accumulated in the p-type region 115$p$ of the storage layer for green 110G1 through the conductive plugs 120A1 and 120A2 and so forth. In the read-out operation, the holes thus accumulated are transferred to the FD 116A.

MODIFICATION EXAMPLE 5

Figure 37:
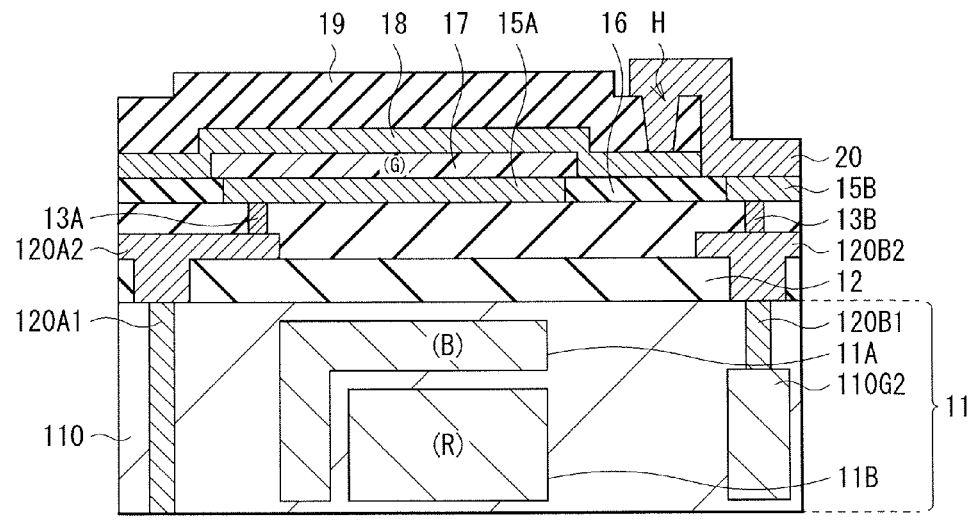
FIG. 37 is a cross-sectional view illustrating a photoelectric conversion element (extraction from an upper side) according to a modification example 5.

FIG. 37 illustrates a configuration of a main part (the organic photoelectric conversion section 11G and the semiconductor substrate 11) of a photoelectric conversion element according to a modification example 5. In the above-described example embodiment and the modification example 4, description has been given on a case that, in the organic photoelectric conversion section 11G, signal charges (electrons or holes) are extracted from the lower electrode 15A. However, a configuration in which signal charges are extracted from the upper electrode 18 may be also possible. A configuration in this case may be as follows; a storage layer for green 110G2 that is embedded in the semiconductor substrate 11 is connected to the conductive plug 120B1, and is conductive with the upper electrode 18 through the conductive plug 120B2, the wiring layers 13B and 15B, and the contact metal layer 20. It is to be noted that by setting a configuration of the storage layer for green 110G2 and a conductivity type of an FD (not illustrated) similarly to those of the above-described example embodiment, and by setting, at the time of charge accumulation, a potential applied to the upper electrode 18 higher than a potential applied to the lower electrode 15A, it is possible to extract electrons as signal charges from the upper electrode 18 and to accumulate the electrons in the storage layer for green 110G2. In this case, holes are discharged from the lower electrode 15A side through the wiring layer 13A, and the conductive plugs 120A1 and 120A2. Alternatively, by setting a configuration of the storage layer for green 110G2 and a conductivity type of an FD (not illustrated) similarly to those of the above-described modification example 4, and by setting, at the time of charge accumulation, the potential applied to the upper electrode 18 lower than the potential applied to the lower electrode 15A, it is possible to extract holes as signal charges from the upper electrode 18 and to accumulate the holes in the storage layer for green 110G2. In this case, electrons are discharged from the lower electrode 15A side through the wiring layer 13A, and the conductive plugs 120A1 and 120A2.

APPLICATION EXAMPLE 1

Figure 38:
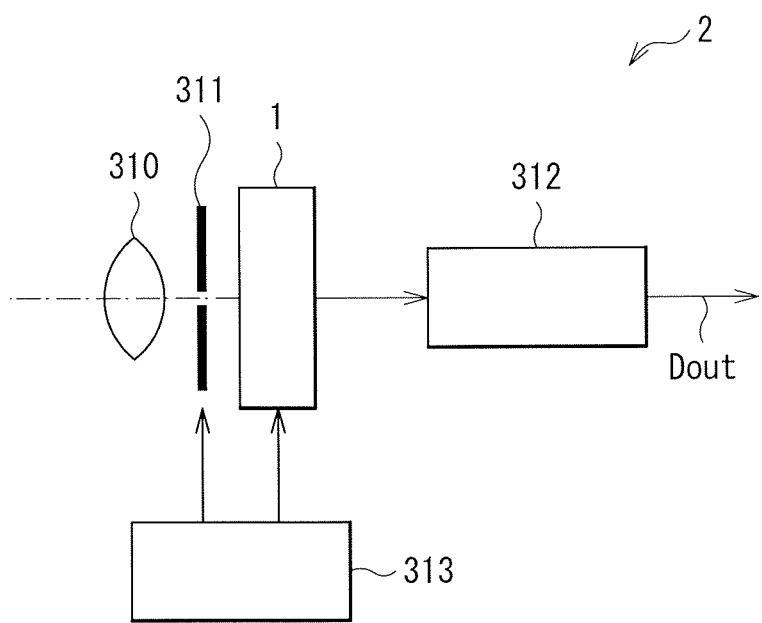
FIG. 38 is a block diagram illustrating an overall configuration of an electronic apparatus using the solid-state image pickup device illustrated in FIG. 1.

The above-described solid-state image pickup device 1 may be applied to various types of electronic apparatuses having an imaging function, for example, a camera system such as a digital still camera or a video camera, or a mobile phone having an imaging function. As an example thereof, FIG. 38 illustrates an overall configuration of an electronic apparatus 2 (a camera). The electronic apparatus 2 is, for example, a video camera capable of taking still images or moving pictures, and may include the solid-state image pickup device 1, an optical system (an optical lens) 310, a shutter device 311, a drive section 313 that is configured to drive the solid-state image pickup device 1 and the shutter device 311, and a signal processing section 312.

The optical system 310 is adapted to guide an image light (an incident light) from an object to be photographed toward the pixel section 1A of the solid-state image pickup device 1. The optical system 310 may be configured of a plurality of optical lenses. The shutter device 311 is adapted to control a light-illumination period and a light-shielding period of the solid-state image pickup device 1. The drive section 313 is adapted to control a transfer operation of the solid-state image pickup device 1 and a shutter operation of the shutter device 311. The signal processing section 312 is adapted to perform various signal processing on a signal outputted from the solid-state image pickup device 1. A picture signal Dout after the signal processing may be stored in a storage medium such as a memory or outputted to a monitor or the like.

Although description has been made by giving the example embodiment as mentioned above, the contents of the present disclosure are not limited to the above-mentioned example embodiment and so forth, and may be modified in a variety of ways.

For example, the buffer film 40 may be configured of, for example, SiO$_2$ deposited by sub-atmospheric CVD. Since the sub-atmospheric CVD allows formation of a film having low mechanical strength, the film having low mechanical strength serves as the buffer film 40, preventing stress of films in the upper layers from being transmitted to the organic photoelectric conversion layer 17. It is therefore possible to expect similar effects to those of the above-described example embodiment.

Moreover, for example, the upper electrode 18, or the protective film 19, or the light-shielding film 30 may be formed separately between the effective pixel region 1B and the OB region 1C, controlling the difference in stress between the effective pixel region 1B and the OB region 1C. Also in this way, it is possible to expect similar effects to those of the above-described example embodiment.

Further, for example, the above-described example embodiment has exemplified a configuration in which the insulating film 16 that electrically separates the lower electrodes 15A is planarized to reduce a level difference with respect to the lower electrode 15A. However, the insulating film 16 may have an opening on the lower electrode 15A, forming a level difference with respect to the lower electrode 15A. However, it is desirable that a side surface of the opening have a gently tapered shape and the organic photoelectric conversion layer 17 be formed in the opening of the insulating film 16.

In addition, for example, in the above-described example embodiment, the photoelectric conversion elements 10B and 10C each have a configuration in which the organic photoelectric conversion section 11G to detect green light and the inorganic photoelectric conversion sections 11B and 11R to detect blue light and red light, respectively, are stacked. However, the contents of the present disclosure are not limited to such a configuration. In other words, the organic photoelectric conversion section may be configured to detect red light or blue light. Alternatively, the inorganic photoelectric conversion section may be configured to detect green light. Moreover, the number of the organic photoelectric conversion sections and the number of the inorganic photoelectric conversion sections, or a ratio thereof are not limited; two or more organic photoelectric conversion sections may be provided; alternatively, a configuration in which a plurality of color signals may be obtained by only the organic photoelectric conversion sections may be also possible. Moreover, the organic photoelectric conversion sections and the inorganic photoelectric conversion sections are not limited to a vertically stacked configuration but may be arranged in parallel along a plane of a substrate.

Furthermore, the above-described example embodiment and so forth have exemplified a configuration of a solid-state image pickup device of a backside illumination type. However, the contents of the present disclosure may be applicable to a solid-state image pickup device of a front illumination type.

In addition, furthermore, it is not necessary for the solid-state image pickup device (the photoelectric conversion element) according to the present disclosure to include all the components described in the above-described example embodiment, and, on the contrary, another layer or other layers may be further provided.

It is to be noted that the present disclosure may have the following configurations.

(1)

A solid-state image pickup device including a pixel section that includes a plurality of pixels, the pixels each including one or more organic photoelectric conversion sections, wherein the pixel section includes an effective pixel region and an optical black region, and the organic photoelectric conversion sections of the optical black region include a light-shielding film and a buffer film on a light-incidence side.

(2)

The solid-state image pickup device according to (1), wherein the organic photoelectric conversion section of the effective pixel region includes an organic semiconductor layer between a first electrode and a second electrode, the organic semiconductor layer having a photoelectric conversion function, and the organic photoelectric conversion section of the optical black region includes the organic semiconductor layer between the first electrode and the second electrode and includes the light-shielding film and the buffer film on the light-incidence side of the organic semiconductor layer.

(3)

The solid-state image pickup device according to (2), including a protective film that is provided between the second electrode and the light-shielding film, wherein the buffer film is provided between the second electrode and the protective film.

(4)

The solid-state image pickup device according to (2), including a protective film that is provided between the second electrode and the light-shielding film, wherein the buffer film is provided between the protective film and the light-shielding film.

(5)

The solid-state image pickup device according to (2), wherein the buffer film is provided between the organic semiconductor layer and the second electrode.

(6)

The solid-state image pickup device according to (2), wherein the buffer film is provided on the light-incidence side of the light-shielding film.

(7)

The solid-state image pickup device according to any one of (1) to (6), wherein the buffer film is configured of at least one of a group consisting of SiN, SiO$_2$, SiON, SiC, SiCN, ITO, Al, and AlO.

(8)

The solid-state image pickup device according to any one of (1) to (7), wherein a difference in stress between the optical black region and the effective pixel region is −150 MPa to 200 MPa both inclusive.

(9)

The solid-state image pickup device according to (8), wherein film stress on the light-incidence side in the optical black region is −150 MPa to 200 MPa both inclusive.

(10)

The solid-state image pickup device according to (8) or (9), wherein film stress on the light-incidence side in the effective pixel region is −150 MPa to 200 MPa both inclusive.

(11)

The solid-state image pickup device according to any one of (1) to (10), wherein the pixels each includes one or more inorganic photoelectric conversion sections that are configured to perform photoelectric conversion in different wavelength ranges from those of the organic photoelectric conversion sections, and in each of the pixels, the one or more organic photoelectric conversion sections and the one or more inorganic photoelectric conversion sections are stacked.

(12)

The solid-state image pickup device according to (11), wherein the inorganic photoelectric conversion sections are embedded in a semiconductor substrate, and the organic photoelectric conversion sections are formed on a first surface side of the semiconductor substrate.

(13)

The solid-state image pickup device according to (12), including a multi-layered wiring layer, the multi-layered wiring layer being formed on a second surface side of the semiconductor substrate.

(14)

The solid-state image pickup device according to (12) or (13), wherein the organic photoelectric conversion sections are configured to perform photoelectric conversion of green light, and in the semiconductor substrate, the inorganic photoelectric conversion section that is configured to perform photoelectric conversion of blue light and the inorganic photoelectric conversion section that is configured to perform photoelectric conversion of red light are stacked.

(15)

A method of manufacturing a solid-state image pickup device, the solid-state image pickup device including a pixel section that includes a plurality of pixels, the pixels each including one or more organic photoelectric conversion sections, the method including:

providing, in the pixel region, an effective pixel region and an optical black region;

forming, in the organic photoelectric conversion section of the effective pixel region, a first electrode, an organic semiconductor layer, and a second electrode in order, the organic semiconductor layer having a photoelectric conversion function; and forming, in the organic photoelectric conversion section of the optical black region, the first electrode, the organic semiconductor layer, the second electrode, and a light-shielding film in order, and forming a buffer layer on the second electrode side of the organic semiconductor layer.

(16)

The method of manufacturing the solid-state image pickup device according to (15), including providing a protective film between the second electrode and the light-shielding film, wherein the buffer film is provided between the second electrode and the protective film.

(17)

The method of manufacturing the solid-state image pickup device according to (15), including providing a protective film between the second electrode and the light-shielding film, wherein the buffer film is provided between the protective film and the light-shielding film.

(18)

The method of manufacturing the solid-state image pickup device according to (15), wherein the buffer film is provided between the organic semiconductor layer and the second electrode.

(19) The method of manufacturing the solid-state image pickup device according to (15), wherein the buffer film is provided on the light-shielding film.

(20)

An electronic apparatus provided with a solid-state image pickup device, the solid-state image pickup device including a pixel section that includes a plurality of pixels, the pixels each including one or more organic photoelectric conversion sections, wherein the pixel section includes an effective pixel region and an optical black region, and the organic photoelectric conversion sections of the optical black region include a light-shielding film and a buffer film on a light-incidence side.

This application claims the benefit of Japanese Priority Patent Application JP 2012-151006 filed on Jul. 5, 2012, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising;
a pixel section that includes a plurality of pixels, the pixels each including one or more organic photoelectric conversion sections,
wherein the pixel section includes an effective pixel region and an optical black region, and
the organic photoelectric conversion sections of the optical black region include a light-shielding film, an organic semiconductor layer having a photoelectric conversion function, and a buffer film between the light-shielding film and the organic semiconductor layer on a light-incidence side of the organic semiconductor layer.

2. The solid-state image pickup device according to claim 1, wherein the organic photoelectric conversion section of the effective pixel region includes the organic semiconductor layer between a first electrode and a second electrode, and
the organic photoelectric conversion section of the optical black region includes the organic semiconductor layer between the first electrode and the second electrode.

3. The solid-state image pickup device according to claim 1,
wherein the buffer film is configured of at least one of a group consisting of SiN, $SiO_2$, SiON, SiC, SiCN, ITO, Al, and AlO.

4. The solid-state image pickup device according to claim 1,
wherein a difference in stress between the optical black region and the effective pixel region is −150 MPa to 200 MPa both inclusive.

5. The solid-state image pickup device according to claim 1, wherein the pixels include one or more inorganic photoelectric conversion sections that are configured to perform photoelectric conversion in different wavelength ranges from those of the organic photoelectric conversion sections, and
in each of the pixels, the one or more organic photoelectric conversion sections and the one or more inorganic photoelectric conversion sections are stacked.

6. The solid-state image pickup device according to claim 2, further comprising a protective film that is provided between the second electrode and the light-shielding film,
wherein the buffer film is provided between the second electrode and the protective film.

7. The solid-state image pickup device according to claim 2, further comprising a protective film that is provided between the second electrode and the light-shielding film,
wherein the buffer film is provided between the protective film and the light-shielding film.

8. The solid-state image pickup device according to claim 2,
wherein the buffer film is provided between the organic semiconductor layer and the second electrode.

9. The solid-state image pickup device according to claim 4,
wherein film stress on the light-incidence side in the optical black region is −150 MPa to 200 MPa both inclusive.

10. The solid-state image pickup device according to claim 4,
wherein film stress on the light-incidence side in the effective pixel region is −150 MPa to 200 MPa both inclusive.

11. The solid-state image pickup device according to claim 5,
wherein the inorganic photoelectric conversion sections are embedded in a semiconductor substrate, and
the organic photoelectric conversion sections are formed on a first surface side of the semiconductor substrate.

12. The solid-state image pickup device according to claim 11, further comprising a multi-layered wiring layer, the multi-layered wiring layer being formed on a second surface side of the semiconductor substrate.

13. The solid-state image pickup device according to claim 11,
wherein the organic photoelectric conversion sections are configured to perform photoelectric conversion of green light, and
in the semiconductor substrate, the inorganic photoelectric conversion section that is configured to perform photoelectric conversion of blue light and the inorganic photoelectric conversion section that is configured to perform photoelectric conversion of red light are stacked.

14. A method of manufacturing a solid-state image pickup device, the solid-state image pickup device including a pixel section that includes a plurality of pixels, the pixels each including one or more organic photoelectric conversion sections, the method comprising:
providing, in the pixel section, an effective pixel region and an optical black region;
forming, in the organic photoelectric conversion section of the effective pixel region, a first electrode, an organic semiconductor layer, and a second electrode, the organic semiconductor layer having a photoelectric conversion function; and
forming, in the organic photoelectric conversion section of the optical black region, the first electrode, the organic semiconductor layer, the second electrode, and a light-shielding film, and forming a buffer layer on the second electrode side of the organic semiconductor layer, wherein the buffer layer is between the organic semiconductor layer and the light-shielding film.

15. The method of manufacturing the solid-state image pickup device according to claim 14, further comprising providing a protective film between the second electrode and the light-shielding film,
wherein the buffer film is provided between the second electrode and the protective film.

16. The method of manufacturing the solid-state image pickup device according to claim 14, further comprising providing a protective film between the second electrode and the light-shielding film,
wherein the buffer film is provided between the protective film and the light-shielding film.

17. The method of manufacturing the solid-state image pickup device according to claim 14, wherein the buffer film is provided between the organic semiconductor layer and the second electrode.

18. An electronic apparatus provided with a solid-state image pickup device, the solid-state image pickup device comprising:
a pixel section that includes a plurality of pixels, the pixels each including one or more organic photoelectric conversion sections,
wherein the pixel section includes an effective pixel region and an optical black region, and
the organic photoelectric conversion sections of the optical black region include a light-shielding film, an organic semiconductor layer having a photoelectric conversion function, and a buffer film between the light-shielding film and the organic semiconductor layer on a light-incidence side of the organic semiconductor layer.

* * * * *